United States Patent
Louria-Hayon et al.

(10) Patent No.: US 12,551,559 B2
(45) Date of Patent: Feb. 17, 2026

(54) CELLS AND METHODS FOR IMPROVED IMMUNOTHERAPY

(71) Applicants: RAMBAM MED-TECH LTD., Haifa (IL); TECHNION RESEARCH & DEVELOPMENT FOUNDATION LIMITED, Haifa (IL)

(72) Inventors: Igal Louria-Hayon, Atlit (IL); Yishai Ofran, Hoshaya (IL); Michal Hayun, Yokneam (IL); Yael Derdikman Ofir, Haifa (IL)

(73) Assignees: RAMBAM MED-TECH LTD., Haifa (IL); TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 1211 days.

(21) Appl. No.: 17/412,572

(22) Filed: Aug. 26, 2021

(65) Prior Publication Data

US 2021/0386784 A1 Dec. 16, 2021

Related U.S. Application Data

(63) Continuation of application No. PCT/IL2020/050218, filed on Feb. 26, 2020.

(60) Provisional application No. 62/810,438, filed on Feb. 26, 2019.

(51) Int. Cl.
| | |
|---|---|
| *A61K 35/17* | (2025.01) |
| *A61K 40/11* | (2025.01) |
| *A61K 40/42* | (2025.01) |
| *A61K 45/06* | (2006.01) |
| *C07K 14/17* | (2006.01) |
| *C07K 14/47* | (2006.01) |
| *C12N 5/0783* | (2010.01) |
| *C12N 5/10* | (2006.01) |

(52) U.S. Cl.
CPC .............. *A61K 45/06* (2013.01); *A61K 40/11* (2025.01); *A61K 40/428* (2025.01); *C07K 14/47* (2013.01); *C12N 5/0638* (2013.01); *A61K 2239/57* (2023.05)

(58) Field of Classification Search
CPC .. A61K 40/11; C12N 5/0638; C12N 2510/00; G01N 33/5047; G01N 33/505
See application file for complete search history.

(56) References Cited

FOREIGN PATENT DOCUMENTS

| WO | WO-2011013129 A1 * | 2/2011 | .......... G01N 33/5005 |
|---|---|---|---|
| WO | 2013019857 A2 | 2/2013 | |
| WO | 2014138348 A1 | 9/2014 | |
| WO | 2016085934 A1 | 6/2016 | |
| WO | 2016208532 A1 | 12/2016 | |
| WO | 2017075451 A1 | 5/2017 | |
| WO | 2019178422 A1 | 9/2019 | |

OTHER PUBLICATIONS

Ha et al., Theranostics 2017, 7(6): 1543-1586.*
Lund et al.,J Neuroimmunology, 2004, 155:161-171.*
Verburgh et al., Clin Rheumatology, 1993, 12(4):494-9.*
Esensten et al.., Allergy Clin Immunol 2018: 142:1710-1718.*
Chen et al., J Immunol Res, 2019, Article ID 5727516, 9 pages.*
Louria-Hayon I, Frelin C, Ruston J, et al. Lnk adaptor suppresses radiation resistance and radiation-induced B-cell malignancies by inhibiting IL-11 signaling. Proceedings of the National Academy of Sciences of the United States of America. Dec. 2013;110(51):20599-20604. DOI: 10.1073/pnas.1319665110. PMID: 24297922; PMCID: PMC3870688.
Velazquez L, Cheng AM, Fleming HE, Furlonger C, Vesely S, Bernstein A, Paige CJ, Pawson T. Cytokine signaling and hematopoietic homeostasis are disrupted in Lnk-deficient mice. J Exp Med. Jun. 17, 2002;195(12):1599-611. doi: 10.1084/jem.20011883. PMID: 12070287; PMCID: PMC2193556.
Carmi Y, Voronov E, Dotan S, Lahat N, Rahat MA, Fogel M, Huszar M, White MR, Dinarello CA, Apte RN. The role of macrophage-derived IL-1 in induction and maintenance of angiogenesis. J Immunol. Oct. 1, 2009;183(7):4705-14. doi: 10.4049/jimmunol.0901511. Epub Sep. 14, 2009. PMID: 19752225.
Katayama H, Mori T, Seki Y, Anraku M, Iseki M, Ikutani M, Iwasaki Y, Yoshida N, Takatsu K, Takaki S. Lnk prevents inflammatory CD8 T-cell proliferation and contributes to intestinal homeostasis. Eur J Immunol. Jun. 2014;44(6):1622-32. doi: 10.1002/eji.201343883. Epub May 2, 2014. PMID: 24536025.
Saleh MA, McMaster WG, Wu J, Norlander AE, Funt SA, Thabet SR, Kirabo A, Xiao L, Chen W, Itani HA, Michell D, Huan T, Zhang Y, Takaki S, Titze J, Levy D, Harrison DG, Madhur MS. Lymphocyte adaptor protein LNK deficiency exacerbates hypertension and end-organ inflammation. J Clin Invest. Mar. 2, 2015;125(3):1189-202. doi: 10.1172/JCI76327. Epub Feb. 9, 2015. PMID: 25664851; PMCID: PMC4362266.
Mori T, Iwasaki Y, Seki Y, Iseki M, Katayama H, Yamamoto K, Takatsu K, Takaki S. Lnk/Sh2b3 controls the production and function of dendritic cells and regulates the induction of IFN-γ-producing T cells. J Immunol. Aug. 15, 2014;193(4):1728-36. doi: 10.4049/jimmunol.1303243. Epub Jul. 14, 2014. PMID: 25024389.
Y. Derdikman, Y. Khier, S. Peled, E. Kenigswald, M. Hayun, I. Louria-Hayon, Y. Ofran. Regulation of CXCR2 receptor signaling in tumor infiltrating T-cells by Lnk adaptor protein [abstract]. In: Abstracts from the 42nd FEBS Congress. Jerusalem Israel; Sep. 10-14, 2017. poster P.4.1015 p. 259.

(Continued)

*Primary Examiner* — Hong Sang
(74) *Attorney, Agent, or Firm* — The Roy Gross Law Firm, LLC; Roy D. Gross

(57) ABSTRACT

Cells comprising an exogenous protein and decreased SH2B adapter protein 3 (SH2B3) protein expression and/or function are provided. Pharmaceutical compositions comprising the cells of the invention as well as methods of treating a disease in a subject in need thereof comprising administering a cell and/or a pharmaceutical composition of the invention, and of determining suitability for treatment, are also provided.

16 Claims, 21 Drawing Sheets
(5 of 21 Drawing Sheet(s) Filed in Color)
Specification includes a Sequence Listing.

(56) References Cited

OTHER PUBLICATIONS

Y. Derdikman, Y. Khier, S. Peled, E. Kenigswald, M. Hayun, I. Louria-Hayon, & Y. Ofran. Regulation of CXCR2 Receptor Signaling in Tumor-infiltrating T-cells by Lnk Adaptor Protein [abstract]. In: Abstracts from the Fourteenth Rambam Research Day Dec. 7, 2017 poster #31 p. 17.

Ding LW, Sun QY, Lin DC, Chien W, Hattori N, Dong XM, Gery S, Garg M, Doan NB, Said JW, Xiao JF, Yang H, Liu LZ, Meng X, Huang RY, Tang K, Koeffler HP. Lnk (SH2B3): paradoxical effects in ovarian cancer. Oncogene. Mar. 12, 2015;34(11):1463-74. doi: 10.1038/onc.2014.34. Epub Apr. 7, 2014. PMID: 24704825; PMCID: PMC4188804.

Laroumanie F, Korneva A, Bersi MR, Alexander MR, Xiao L, Zhong X, Van Beusecum JP, Chen Y, Saleh MA, McMaster WG, Gavulic KA, Dale BL, Zhao S, Guo Y, Shyr Y, Perrien DS, Cox NJ, Curci JA, Humphrey JD, Madhur Ms. Lnk deficiency promotes acute aortic dissection and rupture. JCI Insight. Oct. 18, 2018;3(20):e122558. doi: 10.1172/jci.insight.122558. PMID: 30333305; PMCID: PMC6237478.

Markina, N. et al. "Posters," The FEBS Journal, vol. 284, Sep. 1, 2017, pp. 102-403, XP055925060.

Takizawa H, Kubo-Akashi C, Nobuhisa I, Kwon SM, Iseki M, Taga T, Takatsu K, Takaki S. Enhanced engraftment of hematopoietic stem/progenitor cells by the transient inhibition of an adaptor protein, Lnk. Blood. Apr. 1, 2006;107(7):2968-75. doi: 10.1182/blood-2005-05-2138. Epub Dec. 6, 2005. PMID: 16332975.

Velazquez L. The Lnk adaptor protein: a key regulator of normal and pathological hematopoiesis. Arch Immunol Ther Exp (Warsz). Dec. 2012;60(6):415-29. doi: 10.1007/s00005-012-0194-x. Epub Sep. 19, 2012. PMID: 22990499.

PCT International Search Report for International Application No. PCT/IL2020/050218, mailed May 27, 2020, 6pp.

PCT Written Opinion for International Application No. PCT/IL2020/050218, mailed May 27, 2020, 6pp.

PCT International Preliminary Report on Patentability for International Application No. PCT/IL2020/050218, issued Aug. 25, 2021, 7pp.

* cited by examiner

Interphase

WT

Lnk-/-

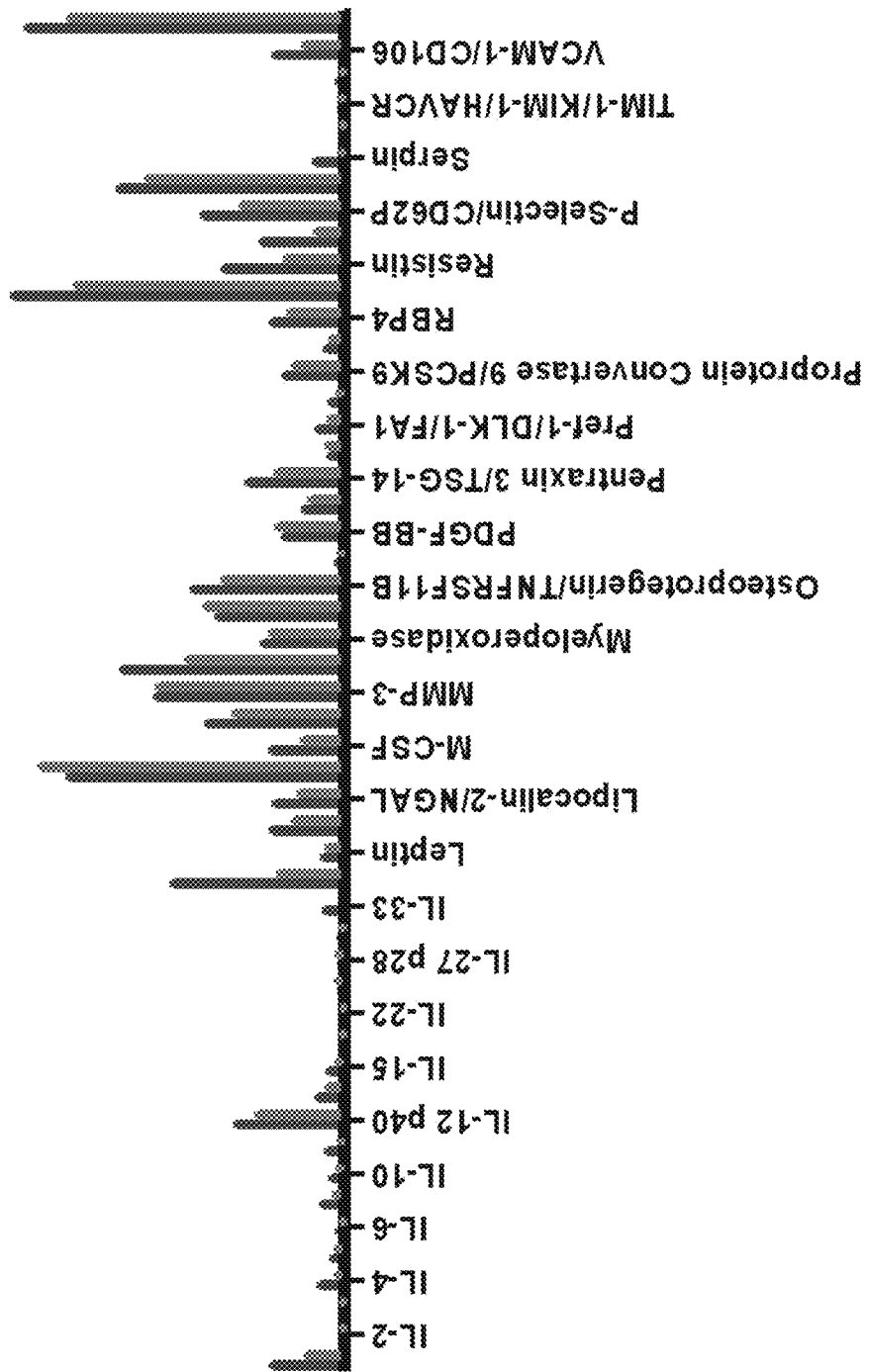
Figure 1Q Continue

CELLS AND METHODS FOR IMPROVED IMMUNOTHERAPY

CROSS REFERENCE TO RELATED APPLICATIONS

This application is a bypass continuation of PCT Patent Application No. PCT/IL2020/050218 having international filing date of Feb. 26, 2020, which claims the benefit of priority of U.S. Provisional Patent Application No. 62/810,438, filed Feb. 26, 2019 both titled: "CELLS AND METHODS FOR IMPROVED IMMUNOTHERAPY", the contents of which are all incorporated herein by reference in their entirety.

FIELD OF INVENTION

The present invention is in the field of immunotherapy.

SUMMARY OF THE INVENTION

The present invention provides cells comprising decreased SH2B adapter protein 3 (SH2B3) protein expression and/or function. The present invention further provides methods of treating a disease in a subject comprising administering a cell comprising decreased SH2B3 expression and/or function, and methods of determining suitability to be so treated.

According to a first aspect, there is provided a method of treating a disease in a subject in need thereof, the method comprising administering to the subject an immune cell comprising decreased SH2B adapter protein 3 (SH2B3) protein expression and/or function, thereby treating the disease.

According to another aspect, there is provided a method of determining suitability of a subject in need thereof to receive a treatment comprising an immune cell comprising decreased SH2B3 protein expression and/or function, the method comprising
   a. receiving a cell associated with a disease from the subject; and
   b. assaying chemotaxis of an unmodified immune cell and an immune cell comprising decreased SH2B3 protein expression and/or function to the pathological cell;
      wherein improved chemotaxis of the immune cell comprising decreased SH2B3 protein expression and/or function as compared to the unmodified immune cell indicates the subject is suitable for the treatment.

According to another aspect, there is provided a method for enhancing an immune response of an immune cell, the method comprising decreasing SH2B3 protein expression and/or function in the cell, thereby enhancing an immune response of an immune cell.

According to another aspect, there is provided a pharmaceutical composition comprising an immune cell comprising decreased SH2B adapter protein 3 (SH2B3) protein expression and/or function.

According to some embodiments, the disease is an immune-associated disease.

According to some embodiments, the immune-associated disease is selected from cancer, Myelodysplastic syndrome (MDS), bacterial infection, fungal infection, viral infection and parasitic infection.

According to some embodiments, the cell is allogenic to the subject.

According to some embodiments, the method further comprises providing an immune cell from the subject and decreasing SH2B3 protein expression and/or function in the provided cell.

According to some embodiments, the decreased SH2B3 protein expression and/or function comprises decreased SH2B3 mRNA levels, SH2B3 protein levels, SH2B3 protein function, or a combination thereof.

According to some embodiments, the decreased SH2B3 protein expression and/or function comprises expression of an SH2B3 inhibitor molecule.

According to some embodiments, the SH2B3 inhibitor molecule is selected from a small nucleic acid molecule that hybridizes to and inhibits SH2B3 mRNA transcription and/or translation, a small molecule inhibitor of SH2B3 protein, an anti-SH2B3 antibody or antigen binding fragment, and a genome editing agent for mutation of a SH2B3 genetic locus.

According to some embodiments, the small molecule inhibitor, antibody or antigen binding fragment is a SH2B3 antagonist.

According to some embodiments, the small molecule inhibitor, antibody, or antigen binding fragment binds to and occludes at least one of a Pleckstrin Homolog (PH) domain, and a Src Homolog 2 (SH2) domain of SH2B3.

According to some embodiments, the small nucleic acid molecule that hybridized to and inhibits SH2B3 is an anti-sense RNA.

According to some embodiments, the immune cell is selected from a T-cell, a B-cell, a natural killer (NK) cell, a neutrophil, a dendritic cell, a myeloid derived suppressor cell and a macrophage.

According to some embodiments, the T-cell is a CD8+ T-cell, CD4+ T-cell or both.

According to some embodiments, the immune cell further comprises a chimeric antigen receptor (CAR).

According to some embodiments, the CAR binds to a target antigen on a cell associated with the disease.

According to some embodiments, the cell is selected from a cancer cell, a bacterial cell, a fungal cell, a parasite cell and a cell infected with a virus.

According to some embodiments, the method further comprises administering an anticancer or anti-pathogen therapeutic treatment.

According to some embodiments, the treatment comprising an immune cell comprising decreased SH2B3 protein expression and/or function is a method of the invention.

According to some embodiments, the assaying chemotaxis is performed ex vivo.

According to some embodiments, the method further comprises treating the subject suitable for treatment by a method of the invention.

According to some embodiments, the decreasing occurs ex vivo.

According to some embodiments, the decreasing comprises introducing an SH2B3 inhibitor molecule into the immune cell.

According to some embodiments, the immune cell is an immune cell to be used for adoptive immunotherapy.

According to some embodiments, the enhancing an immune response comprises at least one of: increasing cytotoxicity of the immune cell and increasing migration of the immune cell.

According to some embodiments, the decreased SH2B3 protein expression and/or function comprises decreased SH2B3 mRNA levels, SH2B3 protein levels, SH2B3 protein function, or a combination thereof.

According to some embodiments, the decreased SH2B3 protein expression and/or function comprises expression of an SH2B3 inhibitor molecule.

According to some embodiments, the SH2B3 inhibitor molecule is selected from a small nucleic acid molecule that hybridizes to and inhibits SH2B3 mRNA transcription and/or translation, a small molecule inhibitor of SH2B3 protein, an anti-SH2B3 antibody or antigen binding fragment, and a genome editing agent for mutation of SH2B3.

According to some embodiments, the small molecule inhibitor, antibody or antigen binding fragment is a SH2B3 antagonist.

According to some embodiments, the small molecule inhibitor, antibody, or antigen binding fragment binds to and occludes at least one of a Pleckstrin Homolog (PH) domain, and a Src Homolog 2 (SH2) domain of SH2B3.

According to some embodiments, the small nucleic acid molecule that hybridized to and inhibits SH2B3 is an anti-sense RNA.

According to some embodiments, the immune cell is selected from a T-cell, a B-cell, a natural killer (NK) cell, a neutrophil, a dendritic cell, a myeloid derived suppressor cell and a macrophage.

According to some embodiments, the T-cell is a CD8+ T-cell, CD4+ T-cell or both.

According to some embodiments, the cell comprises a chimeric antigen receptor (CAR).

According to some embodiments, the CAR binds to a target antigen on a cell associated with a disease.

According to some embodiments, the cell associated with a disease is selected from a cancer cell, a bacterial cell, a fungal cell, a parasite cell and a cell infected with a virus.

According to some embodiments, the cell is produced by providing a cell from a subject and decreasing SH2B3 protein expression and/or function in the extracted cell in vitro.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee

DETAILED DESCRIPTION OF THE INVENTION

Figure 1A:
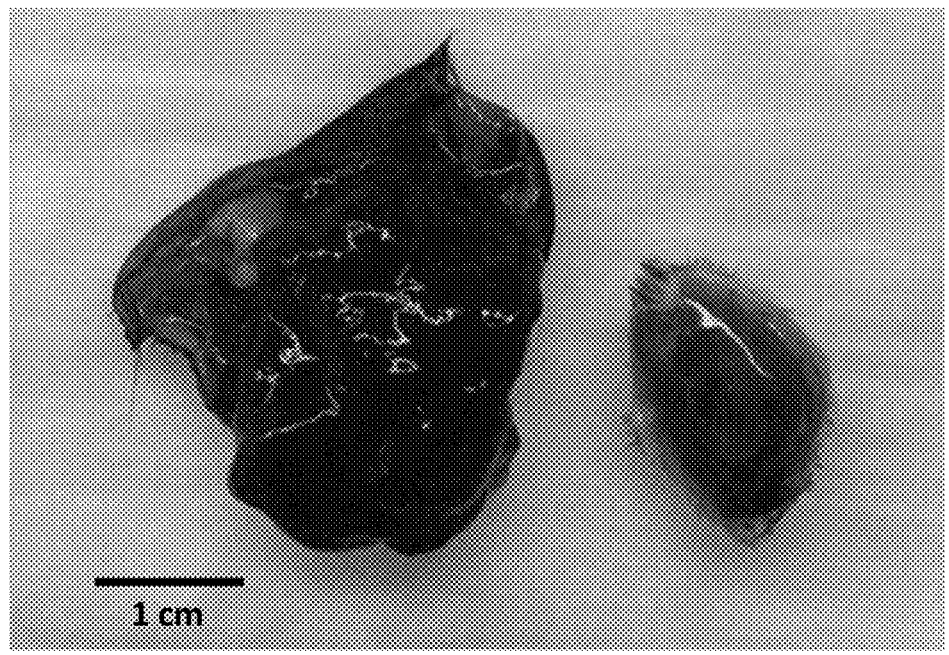
FIGS. 1A-1R: (1A) A representative photograph of subcutaneous tumors growth in WT and Lnk KO mice. (1B) A scatter plot of tumor weight from WT and Lnk KO mice. WT n=23, KO n=25, Error bars indicate ±SEM. (1C) Representative FACS size analyses of single cells from tumors from WT and Lnk KO mice. (1D) A scatter plot of the percentage of TILs in the tumors from WT and Lnk KO mice. WT n=15, KO n=15, Error bars indicate ±SEM. (1E) Representative micrographs of tumor interface from WT and Lnk KO mice. (1F-G) Representative FACS analysis of (1F) CD3-zeta expression and (1G) CD8 and CD4 expression by lymphocytes from tumors from WT and Lnk KO mice. (1H) Representative micrographs of immunohistochemistry staining for the cytotoxic T-cell marker CD8α in tumors of WT host (upper) and Lnk$^{-/-}$ host (lower). Black arrow— positive CD8α T-cells; Asterix—blood vessel. (1I-P) Scatter plots of the percentage of infiltrating cells that are (1I) Total T-cells (CD3), (1J) T-Helper cells (CD4), (1K) Cytotoxic T cells (CD8), (1L) B-cells (CD45R), (1M) NK cells (CD161b/c), (1N) neutrophils (CD11b), (1O) macrophages (F4/80), and (1P) dendritic cells (CD11c). (1Q) A representative bar chart of cytokine levels in the TME as assessed by the Proteome-Profiler Mouse XL Cytokine Array kit (R&D Systems). The supernatants from three tumors from mice of each genotype were pooled. (1R) A representative bar chart of cytokine levels in the TME as assessed by ELISA. The supernatants from three tumors from mice of each genotype were pooled.

The present invention, in some embodiments, provides cells comprising an exogenous protein and decreased SH2B adapter protein 3 (SH2B3) protein expression and/or function. The present invention further concerns pharmaceutical composition comprising those cells as well as a method of treating a disease in a subject comprising administering those cells or compositions. Uses of the cells of the invention, as well as methods of determining suitability to be treated by a method of the invention are also provided.

By a first aspect, there is provided a cell comprising decreased SH2B adapter protein 3 (SH2B3) expression and/or function.

In some embodiments, the cell is a mammalian cell. In some embodiments, the cell is a rodent cell. In some embodiments, the cell is a mouse cell. In some embodiments, the cell is a human cell. In some embodiments, the cell is from a subject. In some embodiments, the subject is in need of immunotherapy. In some embodiments, the subject is in need of adoptive immunotherapy. In some embodiments, the subject comprises healthy immune cells. In some embodiments, the subject comprises immune cells with reduced ability to induce an immune response. In some embodiments, the cells are allogenic to the subject. In some embodiments, the cells are autologous to the subject. In some embodiments, the cells are syngeneic to the subject.

In some embodiments, the cell is an immune cell. In some embodiments, the cell is a hematopoietic cell. In some embodiments, the cell is not a hematopoietic cell. In some embodiments, the immune cell is a T-cell. In some embodiments, the T-cell is a CD8 positive T-cell. In some embodiments, the T-cell is a cytotoxic CD8 positive T-cell. In some embodiments, the T-cell is a CD4 positive T-cell. In some embodiments, the T-cell is a CD4 positive helper T-cell. In some embodiments, the immune cell is a cytotoxic immune cell. In some embodiments, the T-cell is selected from a CD8 positive and a CD4 positive T-cell. In some embodiments, the T-cell is a CD8 positive T-cell, a CD4 positive T-cell or both. In some embodiments, the immune cell is a B-cell. In some embodiments, the immune cell is a natural killer (NK) cell. In some embodiments, the immune cell is a neutrophil. In some embodiments, the immune cell is a dendritic cell. In some embodiments, the immune cell is a macrophage. In some embodiments, the immune cell is a myeloid derived suppressor cell (MDSC). In some embodiments, the cell is selected from a T-cell, a B-cell, an NK cell, a neutrophil, a dendritic cell, an MDSC and a macrophage. In some embodiments, the cell is selected from a T-cell, a B-cell, an NK cell, a neutrophil, a dendritic cell, and a macrophage.

In some embodiments, SH2B3 is mammalian SH2B3. In some embodiments, SH2B3 is rodent SH2B3. In some embodiments, SH2B3 is mouse SH2B3. In some embodiments, SH2B3 is human SH2B3.

In some embodiments, mouse SH2B3 is SH2B3 isoform 1. In some embodiments, mouse SH2B3 is SH2B3 isoform 2. In some embodiments, mouse SH2B3 is SH2B3 isoform X1. In some embodiments, mouse SH2B3 comprises and/or consists of an amino acid sequence selected from those provide in RefSeq IDs NP_032533.1, NP_001293055.1, NP_001293056.1, NP_001293057.1 and XP 006530233.1. In some embodiments, mouse SH2B3 comprises and/or consists of an amino acid sequence provide in RefSeq IDs NP_032533.1, NP_001293055.1, NP_001293056.1, NP_001293057.1 or XP_006530233.1. Each possibility represents a separate embodiment of the invention. In some embodiments, mouse SH2B3 comprises and/or consists of the amino acid sequence provided in RefSeq ID NP_032533.1. In some embodiments, mouse SH2B3 comprises and/or consists of the amino acid sequence (SEQ ID NO: 1)
MNEPTVQPSRTSSAPASPASPRGWSDFCEQHAAAAARELARQYWLFARAH

PQPPRADLVSLQFAELFQRHFCREVRESLAGPPGHDYRATAPPRPALPKA

-continued
RSSEDLGPRPACALQHLRRGLRQLFRRRSAGELPGATSDTNDIDTTAASR

PGPARKLLPWGLREPPTEALKEVVLRYSLADEAAMDSGARWQRGRLVLRS

PGPGHSHFLQLFDPPKSSKPKLQEACSSIREVRPCTRLEMPDNLYTFVLK

VQDQTDIIFEVGDEQQLNSWLAELRASTGLGLEHPDTELPLSLAAEPGPA

RSPRGSTDSLDQGASPGVLLDPACQKTDHFLSCYPWFHGPISRVRAAQLV

QLQGPDAHGVFLVRQSESRRGEYVLTFNLQGRAKHLRLVLTERGQCRVQH

LHFPSVVDMLRHFQRSPIPLECGAACDVRLSGYVVVLSQAPGSSNTVLFP

FSLPHWDSELGHPHLSSVGCPPSHGAEALPGQVTPPEQIFHLVPSPEELA

NSLRQLELESVSSARDSDYDMDSSSRGHLRAIDNQYTPLSQLCREADV.

In some embodiments, mouse SH2B3 is encoded by a nucleic acid molecule comprising or consisting of the nucleotide sequence selected from those provided in a RefSeq IDs NM_008507.4, NM_001306126.1, NM_001306127.1, NM_001306128.1 and XM_006530170.3. In some embodiments, mouse SH2B3 is encoded by a nucleic acid molecule comprising or consisting of the nucleotide sequence provided in a RefSeq ID NM_008507.4, NM_001306126.1, NM_001306127.1, NM_001306128.1 or XM_006530170.3. Each possibility represents a separate embodiment of the invention. In some embodiments, mouse SH2B3 is encoded by a nucleic acid molecule that comprises and/or consists of the nucleotide sequence provided in RefSeq ID NM_008507.4. In some embodiments, mouse SH2B3 is encoded by a nucleic acid molecule that comprises and/or consists of the nucleotide sequence (SEQ ID NO: 2)
ATGAACGAGCCCACCGTGCAGCCGTCCCGCACATCCTCCGCACCCGCCTC

GCCGGCATCCCCACGCGGCTGGAGCGACTTCTGCGAGCAGCACGCAGCAG

CGGCGGCCCGGGAGCTGGCCCGCCAGTACTGGTTGTTTGCGCGCGCGCAC

CCACAGCCGCCGCGCGCGGACCTGGTGTCGCTGCAGTTCGCGGAGCTCTT

CCAGCGCCACTTCTGCCGGGAGGTGCGCGAGAGCCTCGCAGGACCGCCGG

GTCACGACTACCGCGCCACTGCTCCGCCCCGCCCCGCGCTGCCCAAGGCA

CGCAGCTCCGAGGACCTGGGCCCGCGGCCCGCCTGTGCCCTGCAGCACCT

GCGCCGCGGCCTGCGCCAGCTCTTCCGCCGCCGCTCGGCAGGGGAGCTGC

CCGGGGCTACCAGTGACACCAATGACATCGACACCACCGCAGCCAGCAGG

CCGGGCCCGGCCCGCAAGTTGCTACCCTGGGGCCTGCGAGAGCCGCCCAC

TGAGGCGCTCAAGGAGGTCGTATTGCGCTATAGCCTGGCGGACGAGGCAG

CAATGGACAGCGGCGCACGCTGGCAGCGGGGTCGCCTGGTGCTTCGGTCT

CCAGGTCCGGGCCACAGCCACTTTCTGCAGCTCTTCGATCCGCCCAAGAG

CTCAAAGCCCAAGCTCCAAGAGGCCTGTTCCAGCATCCGGGAGGTCCGAC

CATGTACACGCCTGGAGATGCCTGACAACCTCTACACCTTTGTGTTGAAG

GTGCAGGACCAGACAGACATCATCTTTGAGGTGGGAGATGAACAGCAGCT

GAACTCATGGCTGGCAGAGCTCAGGGCAAGCACAGGCCTTGGGCTGGAGC

ACCCGGACACCGAGTTACCTCTTTCCTTAGCGGCAGAGCCTGGCCCAGCT

```
AGATCCCCAAGGGGAAGCACTGACTCCCTGGACCAAGGTGCTTCACCTGG

GGTGTTGCTGGACCCAGCCTGCCAGAAAACAGATCACTTCCTATCCTGCT

ACCCCTGGTTCCACGGCCCCATCTCCAGGGTGAGGGCTGCACAGCTGGTC

CAGCTCCAGGGCCCTGATGCCCACGGCGTGTTCCTGGTGCGGCAGAGTGA

GTCCCGGAGAGGAGAGTATGTACTCACATTCAACTTACAGGGCAGAGCCA

AGCACTTACGCCTGGTGCTCACAGAGCGTGGACAGTGCCGGGTGCAACAC

CTGCACTTCCCCTCGGTGGTAGATATGCTCCGCCACTTCCAGCGTTCTCC

TATCCCACTGGAATGTGGAGCAGCTTGTGACGTCCGACTCTCTGGCTATG

TGGTAGTCCTCTCTCAGGCACCAGGTTCCTCCAACACCGTCCTCTTCCCT

TTTTCCCTTCCTCACTGGGATTCGGAGCTGGGTCATCCCCACCTCAGCTC

TGTTGGCTGTCCCCCCAGCCATGGTGCAGAGGCTCTCCCTGGCCAAGTGA

CACCACCTGAGCAGATCTTCCACCTGGTGCCTTCTCCTGAGGAACTGGCC

AACAGTCTGCGGCAGCTGGAGCTCGAGTCTGTGAGCAGTGCCCGGGACTC

GGACTATGACATGGACTCCTCTTCACGGGGCCACCTTCGGGCCATTGACA

ACCAGTACACCCCTCTCTCACAGCTGTGCAGAGAGGCAGACGTGTGA.
```

In some embodiments, the nucleic acid molecule encoding SH2B3 is selected from a cDNA and an mRNA. In some embodiments, the nucleic acid molecule encoding SH2B3 is a cDNA. In some embodiments, the nucleic acid molecule encoding SH2B3 is an mRNA. It will be understood by a skilled artisan that when the molecule is an mRNA the thymines will be replaced by uracil.

In some embodiments, human SH2B3 is SH2B3 isoform 1. In some embodiments, human SH2B3 is SH2B3 isoform 2. In some embodiments, human SH2B3 is SH2B3 isoform X1. In some embodiments, human SH2B3 is SH2B3 isoform X2. In some embodiments, human SH2B3 is SH2B3 isoform X3. In some embodiments, human SH2B3 is SH2B3 isoform X4. In some embodiments, human SH2B3 is SH2B3 isoform X5. In some embodiments, human SH2B3 is SH2B3 isoform X6. In some embodiments, human SH2B3 comprises and/or consists of an amino acid sequence selected from those provide in RefSeq IDs NP_005466.1, NP_001278353.1, XP_011536021.1, XP_011536022.1, XP_005253875.1, XP_005253876.1, XP_011536023.1, XP_024304558.1, and XP_006719243.1. In some embodiments, human SH2B3 comprises and/or consists of an amino acid sequence provide in RefSeq IDs NP_005466.1, NP_001278353.1, XP_011536021.1, XP_011536022.1, XP_005253875.1, XP_005253876.1, XP_011536023.1, XP_024304558.1, or XP_006719243.1. Each possibility represents a separate embodiment of the invention. In some embodiments, human SH2B3 comprises and/or consists of the amino acid sequence provided in RefSeq ID NP_005466.1. In some embodiments, human SH2B3 comprises and/or consists of the amino acid sequence

```
                                              (SEQ ID NO: 3)
MNGPALQPSSPSSAPSASPAAAPRGWSEFCELHAVAAARELARQYWLFAR

EHPQHAPLRAELVSLQFTDLFQRYFCREVRDGRAPGRDYRDTGRGPPAKA

EASPEPGPGPAAPGLPKARSSEELAPPRPPGPCSFQHFRRSLRHIFRRRS

AGELPAAHTAAAPGTPGEAAETPARPGLAKKFLPWSLAREPPPEALKEAV

LRYSLADEASMDSGARWQRGRLALRRAPGPDGPDRVLELFDPPKSSRPKL

QAACSSIQEVRWCTRLEMPDNLYTFVLKVKDRTDIIFEVGDEQQLNSWMA

ELSECTGRGLESTEAEMHIPSALEPSTSSSPRGSTDSLNQGASPGGLLDP

ACQKTDHFLSCYPWFHGPISRVKAAQLVQLQGPDAHGVFLVRQSETRRGE

YVLTFNFQGIAKHLRLSLTERGQCRVQHLHFPSVVDMLHHFQRSPIPLEC

GAACDVRLSSYVVVVSQPPGSCNTVLFPFSLPHWDSESLPHWGSELGLPH

LSSSGCPRGLSPEGLPGRSSPPEQIFHLVPSPEELANSLQHLEHEPVNRA

RDSDYEMDSSSRSHLRAIDNQYTPL.
```

In some embodiments, human SH2B3 is encoded by a nucleic acid molecule comprising or consisting of the nucleotide sequence selected from those provided in a RefSeq IDs NM_005475.2, NM_001291424.1, XM_011537719.2, XM_011537720.3, XM_005253818.4, XM_005253819.4, XR_001748535.1, XM_011537721.3, XR_001748536.1, XR_002957278.1, XM_024448790.1 and XM_006719180.4. In some embodiments, human SH2B3 is encoded by a nucleic acid molecule comprising or consisting of the nucleotide sequence provided in a RefSeq ID NM_005475.2, NM_001291424.1, XM_011537719.2, XM_011537720.3, XM_005253818.4, XM_005253819.4, XR_001748535.1, XM_011537721.3, XR_001748536.1, XR_002957278.1, XM_024448790.1 or XM_006719180.4. Each possibility represents a separate embodiment of the invention. In some embodiments, human SH2B3 is encoded by a nucleic acid molecule that comprises and/or consists of the nucleotide sequence provided in RefSeq ID NM_005475.2. In some embodiments, human SH2B3 is encoded by a nucleic acid molecule that comprises and/or consists of the nucleotide sequence

```
                                              (SEQ ID NO: 4)
ATGAACGGGCCTGCCCTGCAGCCCTCCTCGCCCTCTTCCGCGCCCTCAGC

CTCCCCGGCGGCGGCCCCGCGGGGCTGGAGCGAGTTCTGTGAGTTGCACG

CCGTAGCGGCGGCCCGGGAGCTGGCCCGCCAGTACTGGCTGTTCGCCCGG

GAGCATCCGCAGCACGCGCCGCTGCGCGCCGAGCTGGTGTCGCTGCAGTT

CACCGACCTCTTCCAGCGCTACTTCTGCCGCGAGGTGCGCGACGGACGGG

CGCCGGGCCGCGACTACCGGGACACAGGCCGTGGGCCCCAGCCAAGGCC

GAGGCGTCCCCGGAGCCAGGCCCCGGCCCCGCCGCCCCTGGCCTGCCCAA

GGCCCGCAGCTCTGAGGAGCTGGCCCCGCCGCGGCCGCCCGGGCCCTGCT

CCTTCCAGCACTTTCGCCGCAGCCTCCGCCACATCTTCCGCCGCCGCTCG

GCCGGGGAGCTGCCAGCGGCCCACACCGCTGCCGCCCCCGGGACCCCCGG

AGAGGCTGCTGAGACCCCCGCCCGGCCTGGCCTGGCCAAGAAGTTCCTGC

CCTGGAGCCTGGCCCGGGAGCCGCCACCCGAGGCGCTGAAGGAGGCGGTG

CTGCGCTACAGCCTGGCCGACGAGGCCTCCATGGACAGCGGGGCACGCTG

GCAGCGCGGGAGGCTGGCGCTGCGCCGGGCCCCGGGCCCGATGGCCCCG

ACCGCGTGCTGGAGCTCTTCGACCCACCCAAGAGTTCAAGGCCCAAGCTA

CAAGCAGCTTGCTCCAGCATCCAGGAGGTCCGGTGGTGCACACGGCTTGA

GATGCCTGACAACCTTTACACCTTTGTGCTGAAGGTGAAGGACCGGACAG
```

-continued

```
ACATCATCTTTGAGGTGGGAGACGAGCAGCAGCTGAATTCATGGATGGCT

GAGCTCTCGGAGTGCACAGGCCGAGGGCTGGAGAGCACAGAAGCAGAGAT

GCATATTCCCTCAGCCCTAGAGCCTAGCACGTCCAGCTCCCCAAGGGGCA

GCACAGATTCCCTTAACCAAGGTGCTTCTCCTGGGGGGCTGCTGGACCCG

GCCTGCCAGAAGACGGACCATTTCCTGTCCTGCTACCCCTGGTTCCACGG

CCCCATCTCCAGAGTGAAAGCAGCTCAGCTGGTTCAGCTGCAGGGCCCTG

ATGCTCATGGAGTGTTCCTGGTGCGGCAGAGCGAGACGCGGCGTGGGGAA

TACGTGCTCACTTTCAACTTTCAGGGGATAGCCAAGCACCTGCGCCTGTC

GCTGACAGAGCGGGGCCAGTGCCGTGTGCAGCACCTCCACTTTCCCTCGG

TCGTGGACATGCTCCACCACTTCCAGCGCTCGCCCATCCCACTCGAGTGC

GGCGCCGCCTGTGATGTCCGGCTCTCCAGCTACGTGGTAGTCGTCTCCCA

ACCACCAGGTTCCTGCAACACGGTCCTCTTCCCTTTCTCCCTTCCTCACT

GGGATTCAGAGTCCCTTCCTCACTGGGGTTCAGAGTTGGGCCTTCCCCAC

CTTAGTTCTTCTGGCTGTCCCCGGGGGCTCAGCCCAGAGGGTCTCCCAGG

GCGATCCTCACCCCCCGAGCAGATCTTCCACCTGGTGCCTTCGCCCGAAG

AACTGGCCAACAGCCTGCAGCACCTGGAGCATGAGCCTGTGAATCGAGCC

CGGGACTCGGACTACGAAATGGACTCATCCTCCCGGAGCCACCTGCGGGC

CATAGACAATCAGTACACACCTCTCTGA.
```

In some embodiments, the nucleic acid molecule encoding SH2B3 is selected from a cDNA and an mRNA. In some embodiments, the nucleic acid molecule encoding SH2B3 is a cDNA. In some embodiments, the nucleic acid molecule encoding SH2B3 is an mRNA. It will be understood by a skilled artisan that when the molecule is an mRNA the thymidines will be replaced by uracil.

In some embodiments, the cell comprises decreased SH2B3 protein expression and/or function. In some embodiments, decreased SH2B3 protein expression and/or function is decreased SH2B3 protein expression, decreased SH2B3 protein function or both. In some embodiments, the cell comprises decreased SH2B3 expression. In some embodiments, the cell comprises decreased SH2B3 protein expression. In some embodiments, the cell comprises decreased SH2B3 protein levels. In some embodiments, the cell comprises decreased SH2B3 mRNA expression. In some embodiments, the cell comprises decreased SH2B3 mRNA levels. In some embodiments, the cell comprises decreased SH2B3 protein function. In some embodiments, a decreased is with respect to an unmodified cell. In some embodiments, an increase is with respect to an unmodified cell. In some embodiments, the unmodified cell and the cell of the invention are the same cell type and the cell of the invention has the decrease.

In some embodiments, the cell lacks SH2B3 protein expression. In some embodiments, the cell is an SH2B3 knockout. In some embodiments, cell comprises a DNA alternation that results in reduced or non-existent SH2B3 protein expression. In some embodiments, the DNA alteration results in reduced or non-existent functional SH2B3 protein expression. In some embodiments, the DNA alteration is selected from a mutation, a deletion and an insertion. In some embodiments, the DNA alteration is a gene trap. In some embodiments, the DNA alteration results in negligible or no protein expression.

In some embodiments, decreased SH2B3 function comprises increased C-X-C Motif Chemokine Receptor (CXCR) signaling. In some embodiments, the CXCR is CXCR1, CXCR2 and/or CXCR3. In some embodiments, decreased SH2B3 function comprises increased CXCR1 signaling. In some embodiments, decreased SH2B3 function comprises increased CXCR2 signaling. In some embodiments, decreased SH2B3 function comprises increased CXCR1 and/or CXCR2 signaling. In some embodiments, decreased SH2B3 function comprises increased Osteopontin (OPN) receptor signaling. In some embodiments, the OPN receptor is CD44. In some embodiments, the OPN receptor is an integrin receptor. In some embodiments, the integrin receptor is alpha 4/beta 1 ($\alpha4\beta1$), $\alpha9\beta1$ or $\alpha9\beta4$. Each possibility represents a separate embodiment of the invention. In some embodiments, the signaling is downstream signaling. In some embodiments, decreased SH2B3 function does not comprise increased receptor expression. In some embodiments, receptor expression is total expression. In some embodiments, receptor expression is surface expression. In some embodiments, decreased SH2B3 function comprises increased phosphorylated effector protein. In some embodiments, the effector protein is Signal Transducer and Activator of Transcription 3 (STAT3). In some embodiments, the effector protein is an extracellular signal-regulated kinas (ERK). In some embodiments, the effector protein is a mitogen-activated protein kinase (MAPK). In some embodiments, the effector protein is Erk1 and/or ERK2. In some embodiments, the ERK is ERK1. In some embodiments, the ERK is ERK2. In some embodiments, the ERK is selected from ERK1 and ERK2. In some embodiments, the effector protein is MAPK3. In some embodiments, the effector protein is STAT3, STATS, AKT, MEK, ERK, MAPK, JAK2, JAK3, JAK, FLT3, P38, SRC, Paxillin, FAK, PLC or PKC. Each possibility represents a separate embodiment of the invention. In some embodiments, decreased SH2B3 function does not comprise increased total effector protein levels.

In some embodiments, the cell comprises a SH2B3 inhibitor molecule. In some embodiments, decreased SH2B3 protein expression and/or function comprises expression of an SH2B3 inhibitor molecule. In some embodiments, the SH2B3 inhibitor molecule is selected from a small nucleic acid molecule that hybridizes to and inhibits SH2B3 mRNA transcription and/or translation, a small molecule inhibitor of SH2B3 protein, an anti-SH2B3 antibody or antigen binding fragment, and a genome editing agent for mutation of SH2B3. In some embodiments, the SH2B3 inhibitor molecule is a small nucleic acid molecule that hybridizes to and inhibits SH2B3 mRNA transcription and/or translation, a small molecule inhibitor of SH2B3 protein, an anti-SH2B3 antibody or antigen binding fragment, or a genome editing agent for mutation of SH2B3.

In some embodiments, the SH2B3 inhibitor molecule is a small nucleic acid molecule. In some embodiments, the small nucleic acid molecule hybridizes to and inhibits SH2B3 mRNA transcription and/or translation. In some embodiments, the small nucleic acid molecule binds to the SH2B3 genomic locus and inhibits transcription. In some embodiments, the small nucleic acid molecule binds to SH2B3 mRNA and inhibits translation. In some embodiments, inhibiting translation comprises inducing mRNA degradation. In some embodiments, the small nucleic acid molecule is single stranded. In some embodiments, the small nucleic acid molecule is double stranded. In some embodiments, the small nucleic acid molecule is single stranded or double stranded. In some embodiments, the small nucleic acid molecule that hybridized to and inhibits SH2B3 is selected from a microRNA (miR), small interfering RNA (siRNA), an RNAi agent, an iRNA agent and a short hairpin RNA (shRNA). In some embodiments, the small nucleic acid molecule that hybridized to and inhibits SH2B3 is a miR, a siRNA, an RNAi agent, an iRNA or an shRNA. Each possibility represents a separate embodiment of the invention. In some embodiments, the small nucleic acid molecule induces RNA interference for SH2B3. In some embodiments, the small nucleic acid molecule that hybridized to and inhibits SH2B3 is an anti-sense RNA. In some embodiments, the anti-sense RNA is an RNA comprising sequence that is antisense to a SH2B3 mRNA. Examples of such nucleic acid molecules can be found, for example, in WO2013/019857, the contents of which are incorporated herein by reference in their entirety.

In some embodiments, the small nucleic acid molecule comprises at least 5, 7, 10, 13, 15, 17, 19, 21, 23 or 25 nucleotides. Each possibility represents a separate embodiment of the invention. In some embodiments, the small nucleic acid molecule comprises at most 15, 17, 19, 21, 23, 24, 25, 26, 27, 29, 31, 33, 35, 37, 39 or 40 nucleotides. Each possibility represents a separate embodiment of the invention. In some embodiments, the small nucleic acid molecule comprises between 13 and 35, 13 and 33, 13 and 31, 13 and 29, 13 and 27, 13 and 26, 13 and 25, 13 and 24, 13 and 23, 13 and 21, 13 and 19, 15 and 35, 15 and 33, 15 and 31, 15 and 29, 15 and 27, 15 and 26, 15 and 25, 15 and 24, 15 and 23, 15 and 21, 15 and 19, 17 and 35, 17 and 33, 17 and 31, 17 and 29, 17 and 27, 17 and 26, 17 and 25, 17 and 24, 17 and 23, 17 and 21, 17 and 19, 19 and 35, 19 and 33, 19 and 31, 19 and 29, 19 and 27, 19 and 26, 18 and 25, 19 and 24, 19 and 23, or 19 and 21. Each possibility represents a separate embodiment of the invention.

In some embodiments, the nucleic acid molecule is brought into the cell as part of a plasmid and/or vector that expresses the nucleic acid molecule. Methods of expressing nucleic acids in a cell are well known in the art and include, for example, electroporation, liposomal transfection, viral transfection, lentiviral infection, and calcium-phosphate transfection. The nucleic acid molecules, such as for example shRNAs, can be directly transferred to the cell, or an expression vector can be used to cause transcription of the molecule with the cell. In some embodiments, the cell comprises the small nucleic acid molecule. In some embodiments, the cell comprises an expression vector comprising or encoding the small nucleic acid molecule. In some embodiments, the expression vector is a mammalian expression vector.

A vector nucleic acid sequence generally contains at least an origin of replication for propagation in a cell and optionally additional elements, such as a heterologous polynucleotide sequence, expression control element (e.g., a promoter, enhancer), selectable marker (e.g., antibiotic resistance), poly-Adenine sequence.

The vector may be a DNA plasmid delivered via non-viral methods or via viral methods. The viral vector may be a lentiviral vector, retroviral vector, a herpesviral vector, an adenoviral vector, an adeno-associated viral vector or a poxviral vector. The promoters may be active in mammalian cells. The promoters may be a viral promoter.

In some embodiments, the small nucleic acid molecule, or a sequence that encodes the small nucleic acid molecule or a polypeptide is operably linked to a promoter. The term "operably linked" is intended to mean that the nucleotide sequence of interest is linked to the regulatory element or elements in a manner that allows for expression of the nucleotide sequence (e.g. in an in vitro transcription/translation system or in a host cell when the vector is introduced into the host cell).

In some embodiments, the vector is introduced into the cell by standard methods including electroporation (e.g., as described in From et al., Proc. Natl. Acad. Sci. USA 82, 5824 (1985)), Heat shock, liposomes, infection by viral vectors, high velocity ballistic penetration by small particles with the nucleic acid either within the matrix of small beads or particles, or on the surface (Klein et al., Nature 327. 70-73 (1987)), and/or the like.

The term "promoter" as used herein refers to a group of transcriptional control modules that are clustered around the initiation site for an RNA polymerase i.e., RNA polymerase II. Promoters are composed of discrete functional modules, each consisting of approximately 7-20 bp of DNA, and containing one or more recognition sites for transcriptional activator or repressor proteins.

In some embodiments, nucleic acid sequences are transcribed by RNA polymerase II (RNAP II and Pol II). RNAP II is an enzyme found in eukaryotic cells. It catalyzes the transcription of DNA to synthesize precursors of mRNA and most snRNA and microRNA.

In some embodiments, mammalian expression vectors include, but are not limited to, pcDNA3, pcDNA3.1 (±), pGL3, pZeoSV2(±), pSecTag2, pDisplay, pEF/myc/cyto, pCMV/myc/cyto, pCR3.1, pSinRep5, DH26S, DHBB, pNMT1, pNMT41, pNMT81, which are available from Invitrogen, pCI which is available from Promega, pMbac, pPbac, pBK-RSV and pBK-CMV which are available from Strategene, pTRES which is available from Clontech, and their derivatives.

In some embodiments, expression vectors containing regulatory elements from eukaryotic viruses such as retroviruses are used by the present invention. SV40 vectors include pSVT7 and pMT2. In some embodiments, vectors derived from bovine papilloma virus include pBV-1MTHA, and vectors derived from Epstein Bar virus include pHEBO, and p2O5. Other exemplary vectors include pMSG, pAV009/A+, pMTO10/A+, pMAMneo-5, baculovirus pDSVE, and any other vector allowing expression of proteins under the direction of the SV-40 early promoter, SV-40 later promoter, metallothionein promoter, murine mammary tumor virus promoter, Rous sarcoma virus promoter, polyhedrin promoter, or other promoters shown effective for expression in eukaryotic cells.

In some embodiments, recombinant viral vectors, which offer advantages such as lateral infection and targeting specificity, are used for in vivo expression. In one embodiment, lateral infection is inherent in the life cycle of, for example, retrovirus and is the process by which a single infected cell produces many progeny virions that bud off and infect neighboring cells. In one embodiment, the result is that a large area becomes rapidly infected, most of which was not initially infected by the original viral particles. In one embodiment, viral vectors are produced that are unable to spread laterally. In one embodiment, this characteristic can be useful if the desired purpose is to introduce a specified gene into only a localized number of targeted cells.

Various methods can be used to introduce the expression vector of the present invention into cells. Such methods are generally described in Sambrook et al., Molecular Cloning: A Laboratory Manual, Cold Springs Harbor Laboratory, New York (1989, 1992), in Ausubel et al., Current Protocols in Molecular Biology, John Wiley and Sons, Baltimore, Md. (1989), Chang et al., Somatic Gene Therapy, CRC Press, Ann Arbor, Mich. (1995), Vega et al., Gene Targeting, CRC Press, Ann Arbor Mich. (1995), Vectors: A Survey of Molecular Cloning Vectors and Their Uses, Butterworths, Boston Mass. (1988) and Gilboa et at. [Biotechniques 4 (6): 504-512, 1986] and include, for example, stable or transient transfection, lipofection, electroporation and infection with recombinant viral vectors. In addition, see U.S. Pat. Nos. 5,464,764 and 5,487,992 for positive-negative selection methods.

It will be appreciated that other than containing the necessary elements for the transcription, the expression construct can also include sequences engineered to optimize stability, production, purification, yield, protein translation or activity of the nucleic acid molecule or polypeptide.

A person with skill in the art will appreciate that a nucleic acid construct administered to the cell employing any suitable mode of administration, described hereinabove. In one embodiment, the nucleic acid construct is introduced into a suitable cell via an appropriate gene delivery vehicle/method (transfection, transduction, homologous recombination, etc.) and an expression system as needed and then the modified cells are expanded in culture and optionally administered to an individual.

In some embodiments, the decrease is at least a 5, 10, 15, 20, 25, 30, 35, 40, 45, 50, 55, 60, 65, 70, 75, 80, 85, 90, 95, 97, 99 or 100% decrease. Each possibility represents a separate embodiment of the invention. Detecting expression of protein and mRNA is well known in the art, and any known method can be used for determining a decrease. Examples of assays that may be used include, but are not limited to, rtPCR, real-time PCR, qPCR, immunostaining, in situ hybridization, western-blotting and ELISA.

In some embodiments, the SH2B3 inhibitor molecule is a small molecule inhibitor of SH2B3. In some embodiments, the SH2B3 inhibitor molecule is an anti-SH2B3 antibody or antigen binding fragment thereof. Anti-SH2B3 antibodies are well known in the art and may be purchased from retailers such as Thermo Fisher, Sigma Aldrich, R&D Systems and Millipore. In some embodiments, the small molecule inhibitor is an SH2B3 antagonist. In some embodiments, the antibody and/or antigen binding fragment is an SH2B3 antagonist. In some embodiments, the small molecule inhibitor, antibody, or antigen binding fragment binds to at least one of protein interacting domain of SH2B3. In some embodiments, the small molecule inhibitor, antibody, or antigen binding fragment occludes a protein interacting domain of SH2B3. In some embodiments, the small molecule inhibitor, antibody, or antigen binding fragment is a competitive antagonist. In some embodiments, the protein interacting domain of SH2B3 is selected from a Pleckstrin Homolog (PH) domain, and a Src Homolog 2 (SH2) domain of SH2B3. In some embodiments, the PH domain comprises and/or consists of amino acids 194-307 of SEQ ID NO: 3. In some embodiments, the PH domain comprises and/or consists of amino acids 206-307 of SEQ ID NO: 3. In some embodiments, the SH2 domain comprises and/or consists of amino acids 364-462 of SEQ ID NO: 3. Suitable antibodies may be generated by techniques known in the art. Animals may be immunized with the domains listed above, or with fragments of those domains or peptides containing those domains.

The term "antagonist" generally refers to a molecule, compound or agent that binds to a target protein at the same site as an agonist, ligand or interacting protein but which does not activate the intracellular response initiated by the active form of the protein, and as such an antagonist can inhibit the intracellular responses by agonists.

As used herein, the term "antibody" refers to a polypeptide or group of polypeptides that include at least one binding domain that is formed from the folding of polypeptide chains having three-dimensional binding spaces with internal surface shapes and charge distributions complementary to the features of an antigenic determinant of an antigen. An antibody typically has a tetrameric form, comprising two identical pairs of polypeptide chains, each pair having one "light" and one "heavy" chain. The variable regions of each light/heavy chain pair form an antibody binding site. An antibody may be oligoclonal, polyclonal, monoclonal, chimeric, camelised, CDR-grafted, multi-specific, bi-specific, catalytic, humanized, fully human, anti-idiotypic and antibodies that can be labeled in soluble or bound form as well as fragments, including epitope-binding fragments, variants or derivatives thereof, either alone or in combination with other amino acid sequences. An antibody may be from any species. The term antibody also includes binding fragments, including, but not limited to Fv, Fab, Fab', F(ab')2 single stranded antibody (svFC), dimeric variable region (Diabody) and disulphide-linked variable region (dsFv). In particular, antibodies include immunoglobulin molecules and immunologically active fragments of immunoglobulin molecules, i.e., molecules that contain an antigen binding site. Antibody fragments may or may not be fused to another immunoglobulin domain including but not limited to, an Fc region or fragment thereof. The skilled artisan will further appreciate that other fusion products may be generated including but not limited to, scFv-Fc fusions, variable region (e.g., VL and VH)~Fc fusions and scFv-scFv-Fc fusions.

Immunoglobulin molecules can be of any type (e.g., IgG, IgE, IgM, IgD, IgA and IgY), class (e.g., IgG1, IgG2, IgG3, IgG4, IgA1 and IgA2) or subclass.

In some embodiments, the SH2B3 inhibitor molecule is a genome editing agent. In some embodiments, the genome editing agent is for excision of SH2B3. In some embodiments, the genome editing agent is for mutation of SH2B3. In some embodiments, mutation of SH2B3 is mutation of the SH2B3 genomic locus. In some embodiments, mutation of the SH2B3 genomic locus results in reduced expression of SH2B3 protein. In some embodiments, mutation of the SH2B3 genomic locus results in no expression of SH2B3 protein.

Genome editing agents are well known in the art. Examples include, but are not limited to CRISPR/Cas9, transcription activator-like effector nucleases (TALEN), zinc finger nucleases, and meganucleases. These agents can be employed for specific modification of a given genomic locus, or even nucleotide. This can be made specific to SH2B3, for examples with a guide RNA specific to a location in the SH2B3 gene. Examples of agents for genomic editing of SH2B3 to decrease its expression can be found for example in WO2016/085934, the contents of which are herein incorporated by reference in their entirety. Guide RNAs (gRNAs) for targeting SH2B3 and decreasing expression are commercially available from vendors such as GenScript and plasmids with the gRNA can be obtained from abmXchange for example.

In some embodiments, the cell further comprises an exogenous protein. In some embodiments, the exogenous protein does not decrease SH2B3 protein and/or function. In some embodiments, the exogenous protein is a synthetic protein. In some embodiments, the exogenous protein is a chimeric protein. In some embodiments, the exogenous protein is a receptor. In some embodiments, the exogenous protein is a surface protein. In some embodiments, the exogenous protein is a chimeric antigen receptor (CAR). In some embodiments, the exogenous protein is a targeting moiety. In some embodiments, the exogenous protein is expressed on the surface of the cell. In some embodiments, the protein is a cytotoxic protein. In some embodiments, the protein is an anti-cancer protein. In some embodiments, the protein is an immune stimulating protein. In some embodiments, the protein binds to a target antigen. In some embodiments, the protein binds to a target antigen on a pathogen. In some embodiments, the protein binds to a target antigen on a pathological cell. In some embodiments, the protein binds to a target antigen on a cell associated with a disease.

In some embodiments, the cell is a CAR cell. In some embodiments, the cell is a CAR-T cell. In some embodiments, the cell is a CAR-NK cell. As used herein, the terms "CAR-T cell" and "CAR-NK cell" refer to an engineered receptor which has specificity for at least one protein of interest (for example an immunogenic protein with increased expression following treatment with an epigenetic modifying agent) and is grafted onto an immune effector cell (a T cell or NK cell). In some embodiments, the CAR-T cell has the specificity of a monoclonal antibody grafted onto a T-cell. In some embodiments, the CAR-NK cell has the specificity of a monoclonal antibody grafted onto a NK-cell. In some embodiments, the T cell is selected from a cytotoxic T lymphocyte and a regulatory T cell.

CAR-T and CAR-NK cells and their vectors are well known in the art. Such cells target and are cytotoxic to the protein for which the receptor binds. In some embodiments, a CAR-T or CAR-NK cell targets at least one viral protein. In some embodiments, a CAR-T or CAR-NK cell targets a plurality of viral proteins. In some embodiments, a CAR-T or CAR-NK cell targets a viral protein with increased expression due to contact with an epigenetic modifying agent.

Construction of CAR-T cells is well known in the art. In one non-limiting example, a monoclonal antibody to a viral protein can be made and then a vector coding for the antibody will be constructed. The vector will also comprise a costimulatory signal region. In some embodiments, the costimulatory signal region comprises the intracellular domain of a known T cell or NK cell stimulatory molecule. In some embodiments, the intracellular domain is selected from at least one of the following: CD3Z, CD27, CD28, OX40, CD30, CD40, PD-1, ICOS, lymphocyte function-associated antigen-1 (LFA-1), CD2, CD 7, LIGHT, NKG2C, B7-H3, and a ligand that specifically binds with CD83. In some embodiments, the vector also comprises a CD3Z signaling domain. This vector is then transfected, for example by lentiviral infection, into a T-cell.

The term "moiety" as used herein refers to a part of a molecule, which lacks one or more atom(s) compared to the corresponding molecule. The term "moiety", as used herein, further relates to a part of a molecule that may include either whole functional groups or parts of functional groups as substructures. The term "moiety" further means part of a molecule that exhibits a particular set of chemical and/or pharmacologic characteristics which are similar to the corresponding molecule, i.e. fluorescence. For example, a fluorescent moiety is part or all of a fluorescent molecule that retains the ability to fluoresce.

As used herein, a "targeting moiety" is a moiety that binds to or interacts with a target cell, and thereby can bring the cell of the invention to the target cell. In some embodiments, a targeting moiety is an antibody or antigen binding fragment thereof that binds a surface protein on the target cell. In some embodiments, the targeting moiety is a ligand or binding partner of a receptor on the target cell. In some embodiments, the targeting moiety binds to a target antigen on a target cell. In some embodiments, the target cell is a cancer cell. In some embodiments, the target cell is a pathogen. In some embodiments, the pathogen is selected from a bacterium, a fungus, a virus, a parasite and a cancer.

In some embodiments, the cell of the invention is produced by extracting a cell from a subject and decreasing SH2B3 protein expression and/or function in the extracted cell in vitro. In some embodiments, the immune cell is obtained from the subject. In some embodiments, SH2B3 protein expression and/or function is decreased in the obtained cell. In some embodiments, the production further comprises expressing in the cell the exogenous protein. In some embodiments, the cell is expanded in vitro.

By another aspect, there is provided a composition comprising a cell of the invention.

In some embodiments, the composition is a pharmaceutical composition. In some embodiments, the composition is configured for administration to a subject. In some embodiments, the composition is configured for systemic administration. In some embodiments, the composition is configured for intravenous administration. In some embodiments, the composition is configured for intratumoral administration.

By another aspect, there is provided a method of treating a disease in a subject in need thereof, the method comprising administering to the subject a cell or composition of the invention, thereby treating the disease.

By another aspect, there is provided a method of treating a disease in a subject in need thereof, the method comprising administering to the subject a cell comprising decreased SH2B3 protein expression and/or function, thereby treating the disease.

By another aspect, there is provided a cell of the invention for use in treating a disease in a subject in need thereof.

By another aspect, there is provided a cell with decreased SH2B3 protein expression and/or function for use in treating a disease in a subject in need thereof.

In some embodiments, the disease is a pathogenic disease. In some embodiments, the disease is a disease treatable by immunotherapy. In some embodiments, the disease is an immune-associated disease. In some embodiments, an immune-associated disease is a disease treatable by immunotherapy. In some embodiments, the disease is a disease that induces IL-8 expression. In some embodiments, the induced IL-8 expression is proximal to the site of disease. In some embodiments, the disease comprises a cell with targetable protein expression. In some embodiments, the disease comprises a cell associated with the disease. In some embodiments, the targetable protein expression is surface protein expression. In some embodiments, the disease is cancer. In some embodiments, the disease is Myelodysplastic syndrome. In some embodiments, the disease is a bacterial infection. In some embodiments, the disease is a fungal infection. In some embodiments, the disease is a viral infection. In some embodiments, the disease is a parasitic infection. It will be understood by one skilled in the art that the exogenous protein may be tailor based on the disease to be treated. A targeting moiety may be selected to target the cell of the invention to a pathogen or cancer cell. Bacterial, viral and fungal proteins are well known in the art, as are cancer specific surface markers. Antibodies, and binding molecules that can be used as targeting moieties are also well known. CARs may be used for targeting cancer cells, and the like.

In some embodiments, the cell associated with the disease is selected from a cancer cell, a precancerous cell, a bacterial cell, a fungal cell, a parasite cell, and a cell infected with a virus. In some embodiments, the cell associated with the disease is selected from a cancer cell, a bacterial cell, a fungal cell, a parasite cell, and a cell infected with a virus. In some embodiments, the cell associated with the disease is a cancer cell. In some embodiments, the cell associated with the disease is a bacterial cell. In some embodiments, the cell associated with the disease is fungal cell. In some embodiments, the cell associated with the disease is a parasite cell. In some embodiments, the cell associated with the disease is a cell infected with a virus. In some embodiments, the cell associated with the disease is an IL-8 expressing cell.

In some embodiments, the method further comprises providing the cell. In some embodiments, the cell is an immune cell. In some embodiments, the cell is from the subject. In some embodiments, the cell is autologous to the subject. In some embodiments, the cell is allogenic to the subject. In some embodiments, the cell is syngeneic to the subject. In some embodiments, the cell is from a healthy donor. In some embodiments, the provided cell is cultured in vitro. In some embodiments, the provided cell is expanded in vitro. In some embodiments, the cell is further enhanced in vitro to improve its immunotherapeutic potential. Such alterations may include gene knockout, or genetic modification or expression of a protein or polypeptide. In some embodiments, the cell is returned to the subject. In some embodiments, the cell is administered to the subject.

In some embodiments, the method is a method of immunotherapy. In some embodiments, immunotherapy is adoptive immunotherapy. In some embodiments, the method is a method of adoptive immunotherapy. In some embodiments, the method is combined with another method of immunotherapy. In some embodiments, cells to be used for immunotherapy are modified by decreasing SH2B3 protein expression and/or functional levels in the cells. In some embodiments, decreasing SH2B3 levels enhances the therapeutic potential of the cells. In some embodiments, the therapeutic potential is immunotherapeutic potential.

As used herein, the term "therapeutic potential" refers to a cells ability to treat and or prevent a disease, disorder or pathological condition as well as improve a subject's overall condition. As used herein, the terms "immunotherapeutic potential" and "therapeutic immune cell potential" are synonymous and refer to the qualitative and/or quantitative therapeutic potential of a beneficial T cell to be, or to become, therapeutic toward a subject's pathology. In some embodiments, the therapeutic potential is any one of regenerating, repairing, replacing, preventing, or protecting potential or a combination thereof.

In some embodiments, administering is administering at least 100, 500, 1000, 5000, 10000, 50000, 100000, 500000, 1000000, 5000000, 10000000, 50000000, 100000000, 500000000, 1000000000, or 5000000000 cells. Each possibility represents a separate embodiment of the invention. In some embodiments, the administering is repeated. In some embodiments, administering is administering at least 1, 2, 3, 4, 5, 6, 7, 8, 9 or 10 times. Each possibility represents a separate embodiment of the invention.

As used herein, the terms "administering," "administration," and like terms refer to any method which, in sound medical practice, delivers a composition containing an active agent to a subject in such a manner as to provide a therapeutic effect. One aspect of the present subject matter provides for oral administration of a therapeutically effective amount of a composition of the present subject matter to a patient in need thereof. Other suitable routes of administration can include parenteral, subcutaneous, intravenous, intramuscular, or intraperitoneal.

The dosage administered will be dependent upon the age, health, and weight of the recipient, kind of concurrent treatment, if any, frequency of treatment, and the nature of the effect desired.

In some embodiments, the method further comprises administering to the subject another therapeutic treatment. In some embodiments, the therapeutic treatment is an anticancer therapeutic treatment. In some embodiments, the therapeutic treatment is an anti-pathogen therapeutic treatment. In some embodiments, a pathogen is selected from a bacterium, a fungus, a virus and a parasite. In some embodiments, a pathogen is a bacterium. In some embodiments, a pathogen is a virus. In some embodiments, a pathogen is a fungus. In some embodiments, a pathogen is a parasite. In some embodiments, the method further comprises administering to the subject an anticancer or anti-pathogen therapeutic treatment. In some embodiments, the method is a combined treatment with a second therapeutic treatment. In some embodiments, the second therapeutic treatment is a different therapeutic modality from an immunotherapy treatment. In some embodiments, the second therapeutic treatment is a different therapeutic modality from a treatment with immune cells. In some embodiments, the therapeutic treatment is selected from the group consisting of: irradiation, chemotherapy, immune checkpoint modulation, CAR therapy, adoptive T cell therapy, small molecule biologics, surgery, bone marrow transplant, targeted drug therapy, cellular ablation and an antibiotic. In some embodiments, the therapeutic treatment is irradiation. In some embodiments, the therapeutic treatment is chemotherapy. In some embodiments, the therapeutic treatment is immune checkpoint modulation. In some embodiments, the therapeutic treatment is CAR therapy. In some embodiments, the therapeutic treatment is adoptive T cell therapy. In some embodiments, the therapeutic treatment is a small molecule biologic. In some embodiments, the therapeutic treatment is surgery. In some embodiments, the therapeutic treatment is bone marrow transplant. In some embodiments, the therapeutic treatment is targeted drug therapy. In some embodiments, the therapeutic treatment is cellular ablation. In some embodiments, the therapeutic treatment is an antibiotic.

In some embodiments, immune checkpoint modulation comprises immune checkpoint blockade. In some embodiments, immune checkpoint blockade comprises administering an immune checkpoint inhibitor. In some embodiments, immune checkpoint blockade is intrinsic checkpoint blockade. In some embodiments, the immune checkpoint is selected from PD-1, PD-L1, CTLA-4 and HVEM. In some embodiments, the immune checkpoint is selected from PD-1, PD-L1, and CTLA-4. Immune checkpoint inhibitors are well known in the art and include, but are not limited to, ipilimumab, nivolumab, pembrolizumab, atezolizumab, avelumab, durvalumab, and cemiplimab.

In some embodiments, the other therapeutic treatment is administered before a cell of the invention. In some embodiments, the other therapeutic treatment is administered after a cell of the invention. In some embodiments, the other therapeutic treatment is administered concomitantly with a cell of the invention. In some embodiments, the other therapeutic treatment enhances the effect of a cell of the invention. In some embodiments, the other therapeutic treatment has an additive effect on the efficacy of a cell of the invention.

By another aspect, there is provided a method for improving a cell to be used for immunotherapy, the method comprising decreasing SH2B3 expression and/or function in the cell, thereby improving the cell to be used for immunotherapy.

By another aspect, there is provided a method for enhancing an immune response of an immune cell, the method comprising decreasing SH2B3 expression and/or function in the immune cell, thereby enhancing an immune response of an immune cell.

In some embodiments, the method is performed in vitro. In some embodiments, the method is performed ex vivo. In some embodiments, the method is performed in culture. In some embodiments, the method is performed in vivo. In some embodiments, the immune cell is a cell to be used for immunotherapy. In some embodiments, the immunotherapy is adoptive immunotherapy.

In some embodiments, enhancing an immune response comprises increasing cytotoxicity of the immune cell. In some embodiments, enhanced cytotoxicity comprises enhanced phosphorylation of STAT3 in the cell. In some embodiments, enhanced cytotoxicity comprises enhanced expression of a proinflammatory cytokine. In some embodiments, the proinflammatory cytokine is interferon gamma. Proinflammatory cytokines are well known in the art, and include, but are not limited to Il-2, interferon gamma, TNF alpha, IL-1 and granulocyte-macrophage colony stimulation factor. Increases expression of any proinflammatory cytokine known in the art may be a readout for enhanced cytotoxicity. In some embodiments, enhancing an immune response comprises increasing migration of an immune cell. In some embodiments, enhancing an immune response comprises increasing invasion of an immune cell. In some embodiments, increasing migration comprises increasing invasion. In some embodiments, migration is to a site of disease. In some embodiments, a site of a disease is a tumor. In some embodiments, a site of disease is a site of infection. In some embodiments, the site of disease is a site with enhanced IL-8 expression. In some embodiments, the site of the disease comprises IL-8 expression. In some embodiments, invasion is to a site of disease. In some embodiments, enhancing an immune response comprises increasing proliferation of the immune cell. In some embodiments, enhancing an immune response comprises increasing the ratio of CD8 T cells to CD4 T cells present in a population of immune cells. In some embodiments, the immune cell is a population of immune cells.

By another aspect, there is provided a method for determining suitability of a subject to receive treatment, the method comprising:
  a. receiving a cell from the subject; and
  b. assaying chemotaxis of an unmodified immune cell and an immune cell comprising decreased SH2B3 protein expression and/or function to the pathological cell;
wherein improved chemotaxis of the immune cell comprising decreased SH2B3 protein expression and/or function as compared to the unmodified immune cell indicates the subject is suitable for a treatment of the invention, thereby determining suitability of a subject to receive treatment.

In some embodiments, the treatment is a treatment comprising an immune cell comprising decreased SH2B3 protein expression and/or function. In some embodiments, the treatment is a treatment comprising administering an immune cell comprising decreased SH2B3 protein expression and/or function. In some embodiments, the treatment is a treatment comprising decreasing SH2B3 protein expression or function in an immune cell. In some embodiments, the immune cell is an immune cell of the subject. In some embodiments, the treatment is a treatment method of the invention.

In some embodiments, the cell is a tumor cell and a tumor biopsy is received. In some embodiments, the cell is put in culture. In some embodiments, the method is performed in vitro. In some embodiments, the method is performed in a laboratory animal. Examples of laboratory animals include, but are not limited to, mice, rats, rabbits, and cats. In some embodiments, the laboratory animal is a mammal. In some embodiments, the laboratory animal is a mouse. In some embodiments, the laboratory animal is immune comprised. In some embodiments, the immune compromised animal is a SCID mouse. In some embodiments, the immune compromised animal is a NOD mouse. In some embodiments, the immune compromised animal is a SCID/NSG mouse. In some embodiments, the assaying chemotaxis is chemotaxis in cell culture. In some embodiments, the assaying chemotaxis is chemotaxis in a laboratory animal. In some embodiments, assaying chemotaxis is a migration assay. In some embodiments, assaying chemotaxis comprises a Transwell assay. In some embodiments, assaying chemotaxis comprises culturing the cell in one compartment of a Transwell and culturing the immune cell in another well of the Transwell dish. In some embodiments, the assaying chemotaxis comprises inserting the cell in a laboratory animal and administering the immune cells to the animal and assaying the ability of the immune cells to reach the cell in the animal. In some embodiments, the cell is injected. In some embodiments, the cell is injected subcutaneously. In some embodiments, the administered immune cells are injected. In some embodiments, a plurality of cells is received and at least one cell is used in a chemotaxis assay with the unmodified cell and at least one cell is used in a chemotaxis assay with the cell comprising decreased SH2B3 protein expression and/or function. In some embodiments, the chemotaxis assay comprises the setup of the "in vitro invasion assay" described herein. In some embodiments, the chemotaxis assay comprises the setup of the "in vitro Matrigel chemotaxis and invasion assay" described herein. In some embodiments, the in assay does not comprise addition of an inhibitor and/or a test molecule.

In some embodiments, improved chemotaxis is increased chemotaxis. In some embodiments, an increase is at least a 10, 20, 25, 30, 40, 50, 60, 70, 75, 80, 90, 95, 97, 99, 100, 125, 150, 175, 200, 250, 300, 350, 400, 450, or 500% increase. Each possibility represents a separate embodiment of the invention. In some embodiments, a decrease is at least a 10, 20, 25, 30, 40, 50, 60, 70, 75, 80, 90, 95, 97, 99 or 100% decrease. Each possibility represents a separate embodiment of the invention. In some embodiments, improved chemotaxis is an increase in the number of cells that reach the cell.

In some embodiments, the method further comprises treating the suitable subject. In some embodiments, the treatment is by any one of the methods of the invention.

As used herein, the term "about" when combined with a value refers to plus and minus 10% of the reference value. For example, a length of about 1000 nanometers (nm) refers to a length of 1000 nm+−100 nm.

It is noted that as used herein and in the appended claims, the singular forms "a," "an," and "the" include plural referents unless the context clearly dictates otherwise. Thus, for example, reference to "a polynucleotide" includes a plurality of such polynucleotides and reference to "the polypeptide" includes reference to one or more polypeptides and equivalents thereof known to those skilled in the art, and so forth. It is further noted that the claims may be drafted to exclude any optional element. As such, this statement is intended to serve as antecedent basis for use of such exclusive terminology as "solely," "only" and the like in connection with the recitation of claim elements or use of a "negative" limitation.

In those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B".

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination. All combinations of the embodiments pertaining to the invention are specifically embraced by the present invention and are disclosed herein just as if each and every combination was individually and explicitly disclosed. In addition, all sub-combinations of the various embodiments and elements thereof are also specifically embraced by the present invention and are disclosed herein just as if each and every such sub-combination was individually and explicitly disclosed herein.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

Various embodiments and aspects of the present invention as delineated hereinabove and as claimed in the claims section below find experimental support in the following examples.

EXAMPLES

Generally, the nomenclature used herein, and the laboratory procedures utilized in the present invention include molecular, biochemical, microbiological and recombinant DNA techniques. Such techniques are thoroughly explained in the literature. See, for example, "Molecular Cloning: A laboratory Manual" Sambrook et al., (1989); "Current Protocols in Molecular Biology" Volumes I-III Ausubel, R. M., ed. (1994); Ausubel et al., "Current Protocols in Molecular Biology", John Wiley and Sons, Baltimore, Md. (1989); Perbal, "A Practical Guide to Molecular Cloning", John Wiley & Sons, New York (1988); Watson et al., "Recombinant DNA", Scientific American Books, New York; Birren et al. (eds) "Genome Analysis: A Laboratory Manual Series", Vols. 1-4, Cold Spring Harbor Laboratory Press, New York (1998); methodologies as set forth in U.S. Pat. Nos. 4,666,828; 4,683,202; 4,801,531; 5,192,659 and 5,272,057; "Cell Biology: A Laboratory Handbook", Volumes I-III Cellis, J. E., ed. (1994); "Culture of Animal Cells—A Manual of Basic Technique" by Freshney, Wiley-Liss, N. Y. (1994), Third Edition; "Current Protocols in Immunology" Volumes I-III Coligan J. E., ed. (1994); Stites et al. (eds), "Basic and Clinical Immunology" (8th Edition), Appleton & Lange, Norwalk, Conn. (1994); Mishell and Shiigi (eds), "Strategies for Protein Purification and Characterization—A Laboratory Course Manual" CSHL Press (1996); all of which are incorporated by reference. Other general references are provided throughout this document.

Materials and Methods

Mice model: $Lnk^{-/-}$ mice (a gift from Tony Pawson's lab) were backcrossed 10 generations into C57BL/6J-Ly5.2-$Gpi1^{b/b}$ [1], [2]. Wield-type (WT) C57BL/6JOlaHsd mice were obtained from the Pre-Clinical Research Authority at the Technion Faculty of Medicine. Experiments were approved and mice were housed and manipulated according to the guidelines of the Animal Care and Use Committee of the Technion.

Cell lines: B16-F10 murine melanoma cells were cultured in RPMI 1640 supplemented with 10% FCS, 1% L-glutamine and 1% Penicillin-Streptomycin. LL/2 (LLC1) murine Lewis Lung Carcinoma cells were cultured in DMEM supplemented with 10% FCS, 1% L-glutamine and 1% Penicillin-Streptomycin.

Tumor model: For the subcutaneous melanoma model, $1.4 \times 10^6$ B16-F10 cancer cells were subcutaneously injected into WT or $Lnk^{-/-}$ mice at the rear back. After 14 days mice were euthanized and tumors, spleens and inguinal lymph nodes were harvested. The length and width of tumors were measured with a manual caliper prior to harvest and tumors were weighted post-harvest.

For the subcutaneous Lewis Lung Carcinoma model, $1.4 \times 10^6$ LL/2 (LLC1) cancer cells were used in the same manner.

Preparation of cells: Single cell suspensions of each organ were prepared as follows. Briefly, spleens and lymph nodes were ground and filtered through a 40 μm cell strainer. Cells were washed and RBCs were lysed when necessary with ammonium chloride lysis buffer (0.15M NH4Cl, 0.1 mM Na2EDTA, and 10 mM KHCO3). Cells were cultured in the proper media for the following experiment.

Tumors and Matrigel plugs were cut into small pieces and digested with Collagenase IV, DNase IV and Hyaluronidase V (Sigma-Aldrich) in HBSS for 60 min at 37° C. with stirring [3]. Supernatants were collected and stored in −20° C. for cytokine analysis. Cells were washed and RBCs were lysed when necessary with ammonium chloride lysis buffer. Recovered cells were used for flow cytometry analysis.

Flow Cytometry: Single cell suspensions ($1\text{-}5 \times 10^6$ cells) were washed and suspended in cold PBS supplemented with 2% FCS, and 1 mM EDTA. The following fluorochrome-conjugated antibodies were purchased from BioLegend: Pacific Blue-, PE- or APC-anti mouse CD8α (clone 53-6.7); Pacific Blue-anti mouse CD4 (clone RM4-5); APC-anti mouse CD19 (clone 6D5); PerCP/Cy5.5-anti mouse CD182 (CXCR2) (clone SA044G4); Alexa Fluor700- or PE-anti mouse CD3 (clone 17A2); FITC- or PE-anti mouse/human CD45R/B220 (clone RA3-6B2);

The following fluorochrome-conjugated antibodies were purchased from Miltenyi Biotec: PE-Vio770 anti mouse NK1.1 (clone PK136); FITC-anti mouse CD19 (clone 6D5). The following fluorochrome-conjugated antibodies were purchased from BD Biosciences: PE-anti mouse CD181 (CXCR1) (cloneU45-632).

Fluorescent data was collected on LSR Fortessa cell analyzer (BD Biosciences). Fluorescent data of the modified chemotaxis assay was collected on Attune NxT acoustic focusing cytometer (Thermo Fisher Scientific). Results were analyzed using FlowJo software (Tree Star).

Histology and immunohistochemistry: Hematoxylin/eosin staining of representative tumors derived from WT or Lnk-/- and CD8α (D4W2Z) XP Rabbit mAb (#98941, Cell Signaling Technologies) immunohistochemistry on Tumor section is shown.

Cytokine analysis: Adjacent to the process of tumor dismantling into single-cell suspension, primary supernatants were collected and stored in -20° C. for further analysis. The cytokine profile at the tumor microenvironment fluid was screened using Proteome Profiler Mouse XL Cytokine Array (R&D Systems; Cat. ARY028). The presence of selected cytokines was verified by ELISA, and their concentration was determined as well. Results were obtained and quantified using pixel density measurements using ImageJ software. The tumor-supernatant were collected and evaluated using ELISA for Mip-2 (mouse MIP-2 ELISA; RayBiotech), IL-6, and IL-10 (ELISA MAX standard kit; BioLegend). The data was acquired and processed using ELISA reader and GeneS software (biotek).

In-vivo Matrigel chemotaxis and invasion assay: An In-vivo study of adoptive cell transfer and Matrigel plug assay to determine the role of Lnk regulation in the migratory and invasion capacities of CD8+ T-cells. Experimental design: B16-F10 melanoma cells were transplanted subcutaneously into WT and Lnk-/- donors. Spleen of tumor bearing donor (WT or Lnk-/-) was harvested on day 14, and CD8+ T-cells were isolated from the total splenocyte population. The isolated CD8+ T-cells (WT or Lnk-/-) were then covalently labeled with CellTrace Violet (C34557, Thermo Fisher Scientific), and transferred to WT recipient. Each WT recipient was transferred by spleen derived CD8+ T-cells from a single tumor bearing donor, either WT or Lnk-/-.

Following cell transfer, recipient was subcutaneously injected with two chemokine carrying Matrigel-plugs at the rear flank, every plug containing a single chemokine on each flank, as illustrated.

Matrigel (Corning, 354234): The bilateral combination of chemokine containing plugs on a single recipient was either of the following [left plug:right plug]—water:water; Mip-2:water; SDF-1α:Mip-2. On day 15, chemokine boost was given to each Matrigel plug. On day 16, plugs were harvested, dissolved and analyzed by flow cytometry for the amount of fluorescent labeled CD8+ T-cells in each plug.

In vitro invasion assay: The role of Lnk regulation in the CXCR1/2-mediated migration of T-cells to melanoma was examined in vitro by a chemotaxis assay modified with Matrigel. 0.25×106 B16-F10 cells were cultured and incubated in a 24-well Cell Culture Receiver plate (M8812, Sigma-Aldrich), that was used as the lower wells of a Transwell systems. Inguinal lymph nodes were isolated from either WT or Lnk-/- melanoma tumor bearing mice and were either treated or not treated with the CXCR1/2 inhibitor SCH563705 (cat. A15234, AdooQ Bioscience) at a final concentration of 500 nM/0.1×10$^6$ Cells. Lymph node cells were then placed into inserts with 3.0 μm pore polyethylene terephthalate (PET) membrane (MCSP24H48, Millicell), that were used as the upper wells of the Transwell systems. Prior to incubation, the exterior portion of the membrane on the upper well was pre-coated with a thin layer of Matrigel (Corning, 354234).

The cells in the upper and lower wells were co-cultured for 16 hours. Cells were then collected off the lower well, stained for CD3, CD8 and CD4 markers and counted using an acoustic flow-cytometer.

Western blot: Western blot analysis of purified WT and KO Lnk cells. ERK and STAT3 phosphorylation and total ERK STAT3protein content were analyzed before and after stimulation with Mip2, IL-8 cytokines for 5 minutes. Obtained bends were quantified using ImageJ software (NIH). Columns of the left graph represent the ratio of p-STAT3 to total STAT3 over the background.

Statistical analysis: To compare tumor mass, size of infiltrating cell population, and surface marker expression we performed unpaired t test with Welch's correction. To compare in-vitro chemotaxis under CXCR1/2 inhibition we performed unpaired t test between treated and not-treated cell groups. To compare in-vivo cell infiltration into Matrigel plugs we performed ordinary one-way ANOVA with multiple comparisons post hoc.

Statistically significant p values were labeled as follows: *P-val<0.05; P-val<0.01; *P-val<0.001; ****P-val<0.0001. The error bars indicate mean±SEM. The data was analyzed using Prism software (GraphPad).

Intracellular INFγ staining: Inguinal lymph nodes (LN) were harvested from either naïve or tumor bearing mice, and single cell suspensions were prepared as described herein. A total of 1×10$^5$ isolated LN cells were incubated ex-vivo for a total time of 6 hours in 5% FCS RPMI with 50 U/ml IL-2 (PEPROTECH) and 5 ug/ml Brefeldin A (BFA, BioLegend) alone, or were concurrently stimulated by adding PMA (Santa cruz) and Ionomycin (CAYMAN chemicals) to a final concentration of 50 ng/ml and 750 ng/ml, respectively. Following stimulation, cells were FC blocked (anti-CD16/32; BioLegend), surface stained with CD3, CD8α and CD4 (17A2, 53-6.7 and RM4-5; BioLegend), fixed and permeabilized with CytoFix/CytoPerm (BD Biosciences), and stained for intracellular INFγ (XMG1.2; BioLegend). Samples that were not stimulated with PMA and Ionomycin were used to assess specific individual cytokine production. Fluorescence minus one (FMO) controls excluding INFγ were used in all experiments. Cells were acquired by flow cytometry (BD Biosciences HTS LSR Fortessa II) and analyzed using FlowJo (Tree Star). Geometric mean fluorescence intensity (gMFI) was normalized to the average expression of un-stimulated cells and expressed as fold induction.

Example 1: Lnk KO Mice Show Decreased Tumor Size

SH2B adapter protein 3 (SH2B3), also known as lymphocyte adapter protein LNK, is a small adapter protein of molecular weight 66 kilodaltons and comprising 575 amino acids. The protein has two major domains, a 3' phoshpotyrosine binding domain (Src homology 2, SH2) and a more 5' membrane localization domain (pleckstrin homology domain, PH). Lnk regulates intracellular cytokine signaling by binding phosphorylated tyrosine residues on activated target proteins through its SH2 domain. Examples of such proteins include MAPK3, FLT3, KIT, JAK2, JAK3, LCK, PDGRFB, FMS, MPL, TRKA, PDGRFA and TCR-zeta. Binding of Lnk inhibits the signaling cascades downstream to the protein target. Moreover, Lnk functions broadly as a hub-inhibitor, by binding a variety of activated intracellular signaling molecules.

It was hypothesized that LNK may play a role in regulation of anti-tumor immune response. To test this hypothesis, wild-type (WT) and Lnk knockout (KO) mice (Lnk−/−) were subcutaneously injected with B16-F10 melanoma cells and tumor growth was monitored for 14 days. After 2 weeks, the animals were sacrificed, and the tumors were harvested and measured. Tumor sections were fixed in 4% formaldehyde solution for histological and immunohistochemical analysis, while other sections of tumor were enzymatically dissolved into single-cell suspensions for flow cytometric analysis. Following the dissolution into single cells the supernatant was also collected in order to screen for the cytokine profile of the tumor microenvironment (TME). Cytokine measurement was performed by ELISA.

Figure 1B:
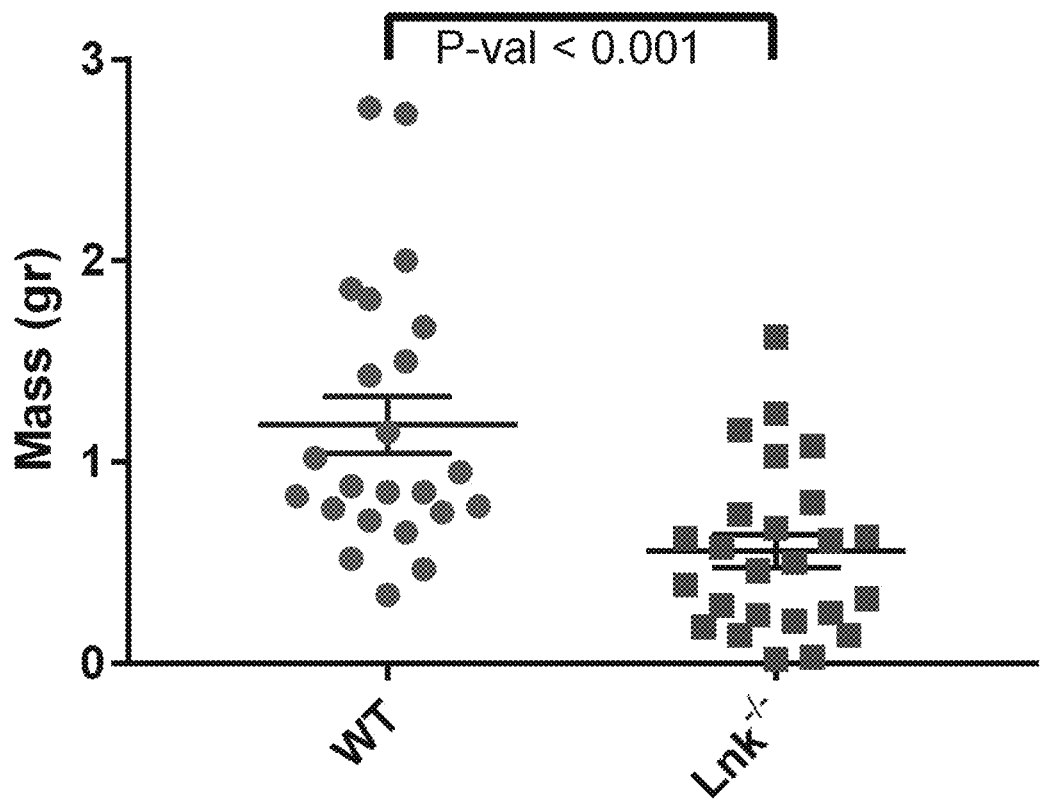
Figure 1C:
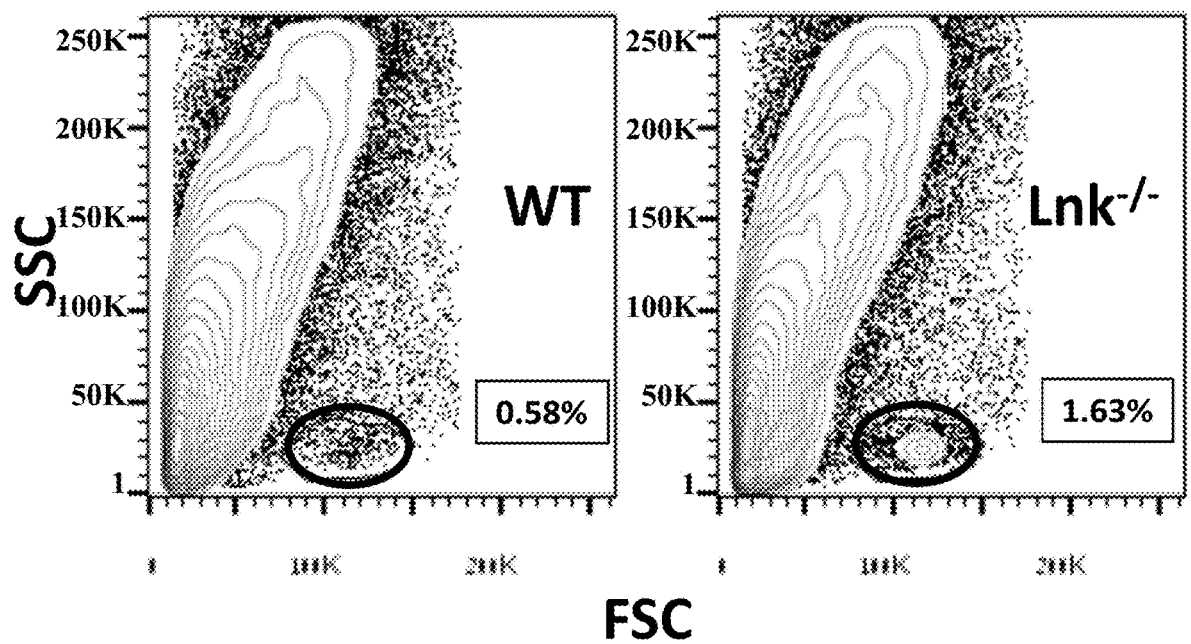
Figure 1D:
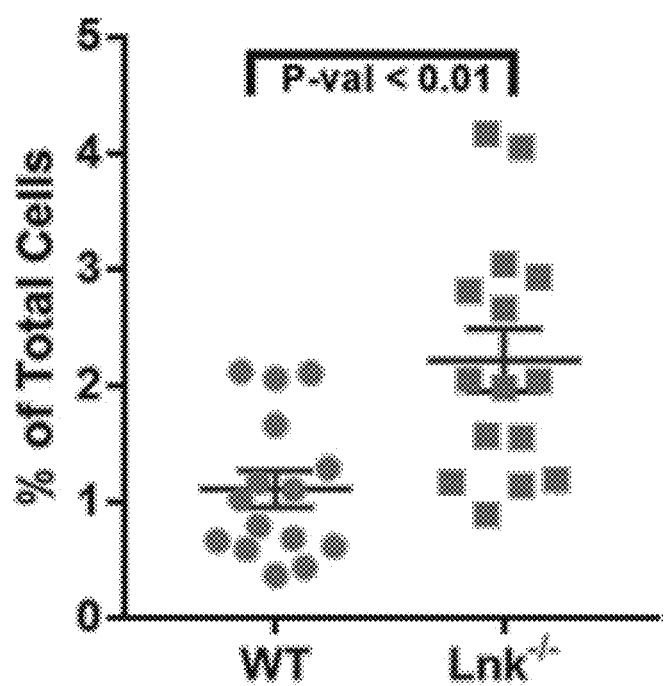
Figure 1E:
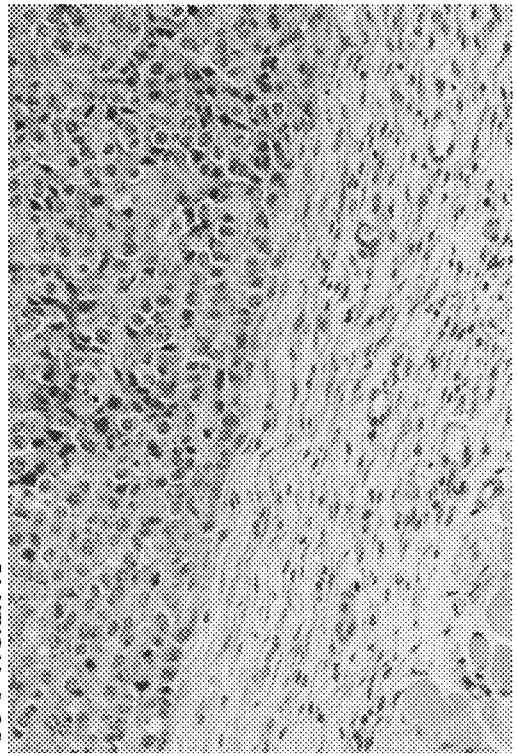
Figure 1E:
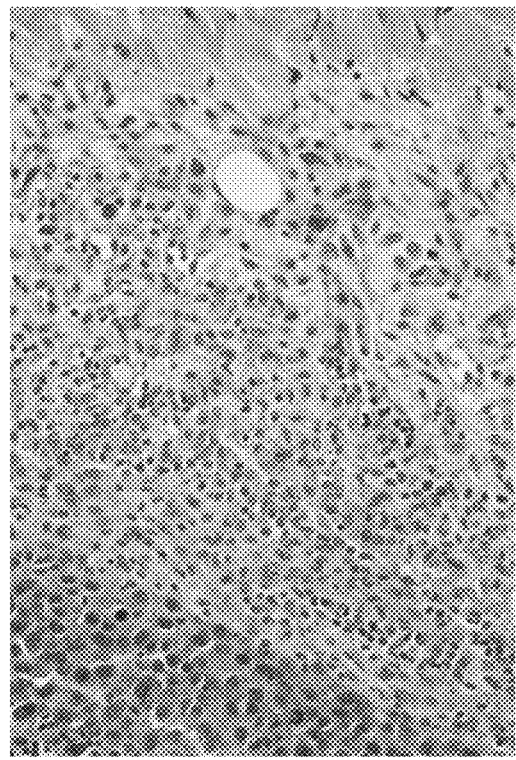
Figure 1E:
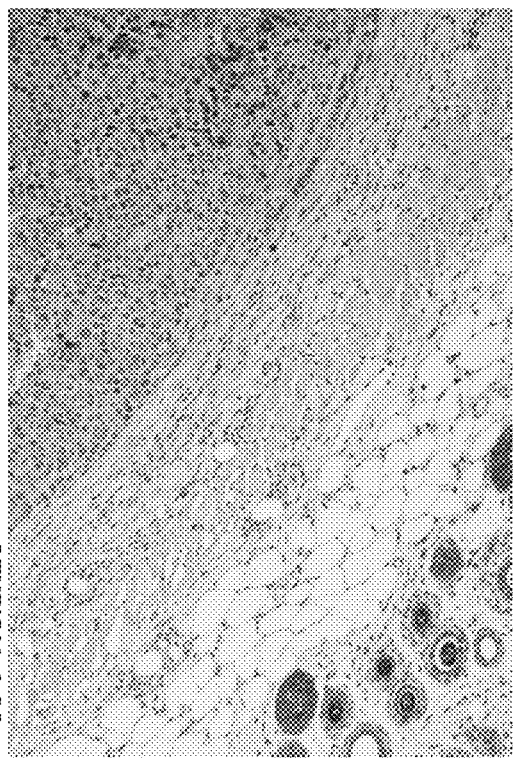
Figure 1E:
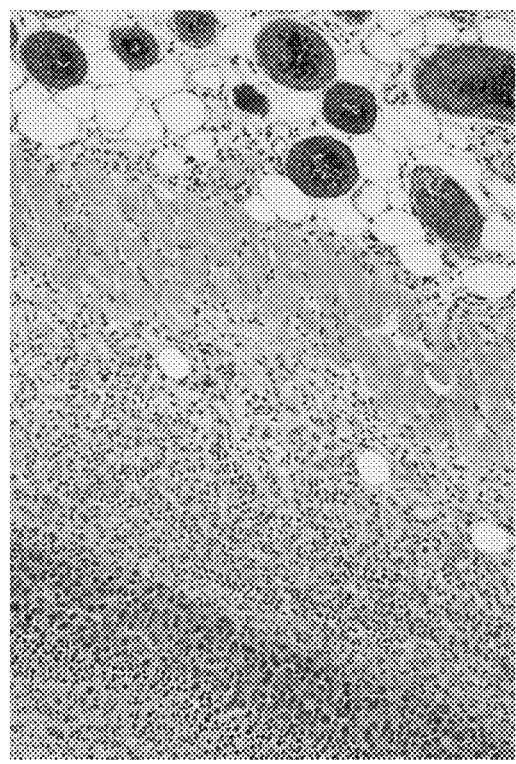

The tumors extracted from Lnk KO mice were visibly smaller than those from WT mice (FIG. 1A), with the average weight of tumors from KO mice being about one-third of the weight from WT mice (FIG. 1B). FACS analysis of the single cell suspension from the tumors (FIG. 1C) indicated that tumors from Lnk KO mice had a statistically significant increase in tumor infiltrating lymphocytes (TIL) as compared to tumors from WT mice (FIG. 1D). This increase was confirmed by FACS with lymphocyte-specific markers. Histological analysis confirmed the increased cellular infiltration into the interphase of tumors from Lnk KO mice (FIG. 1E).

Figure 1F:
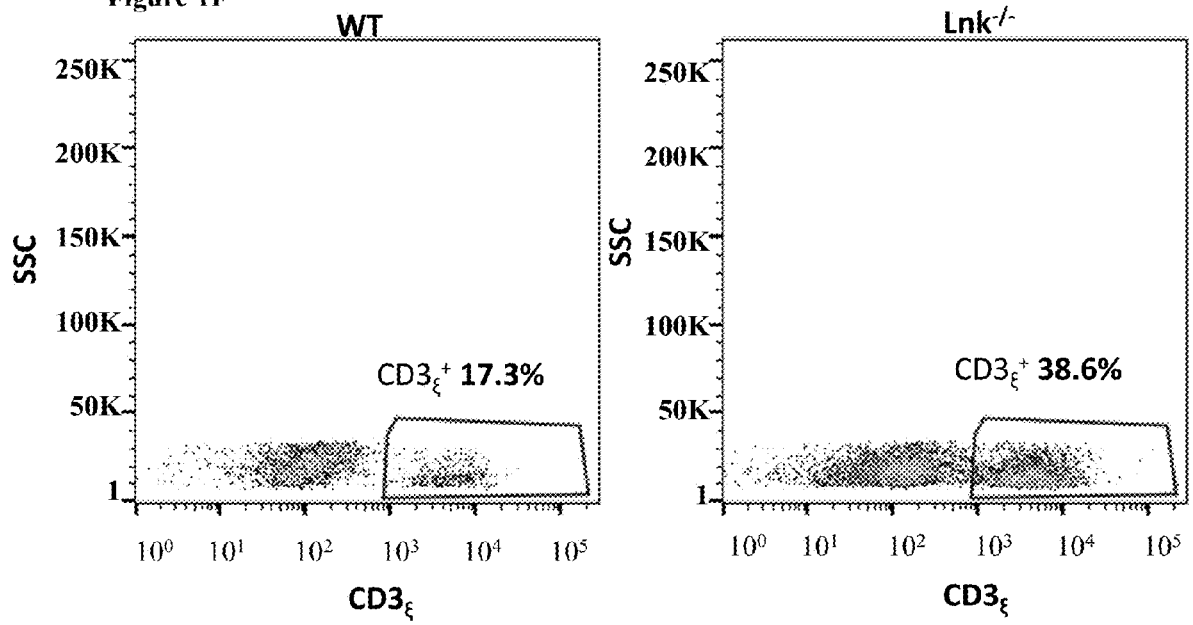
Figure 1G:
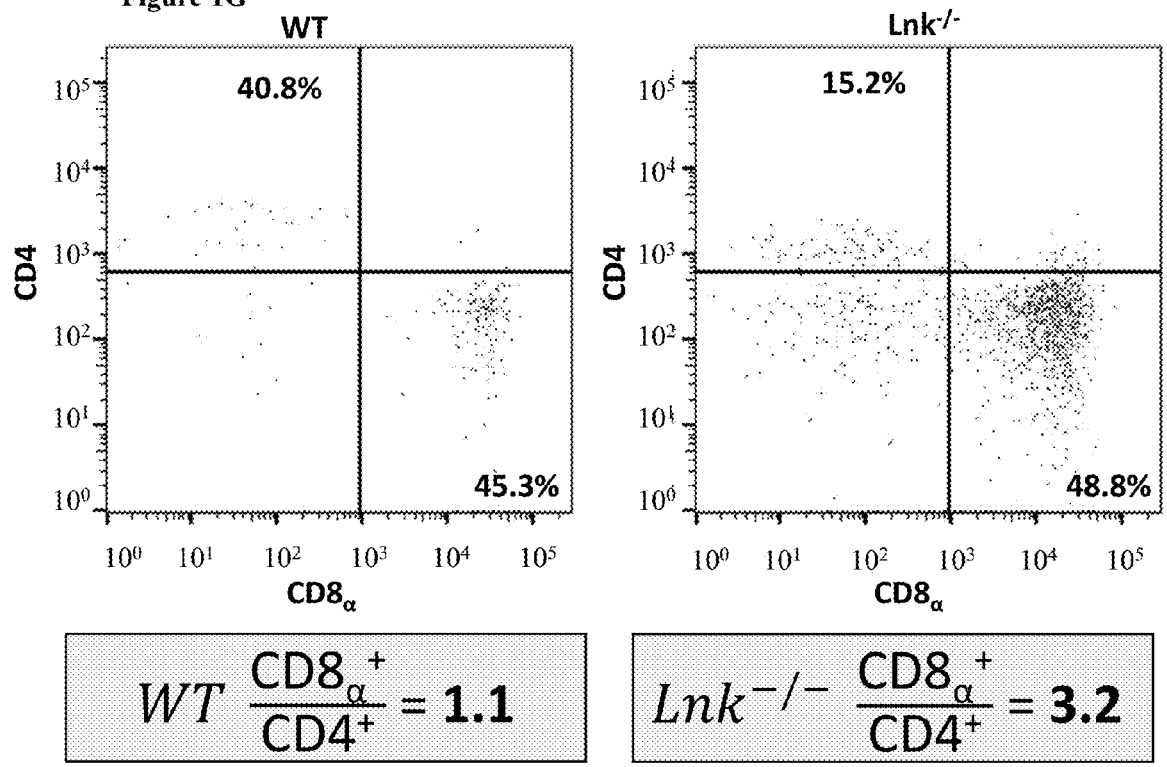
Figure 1H:
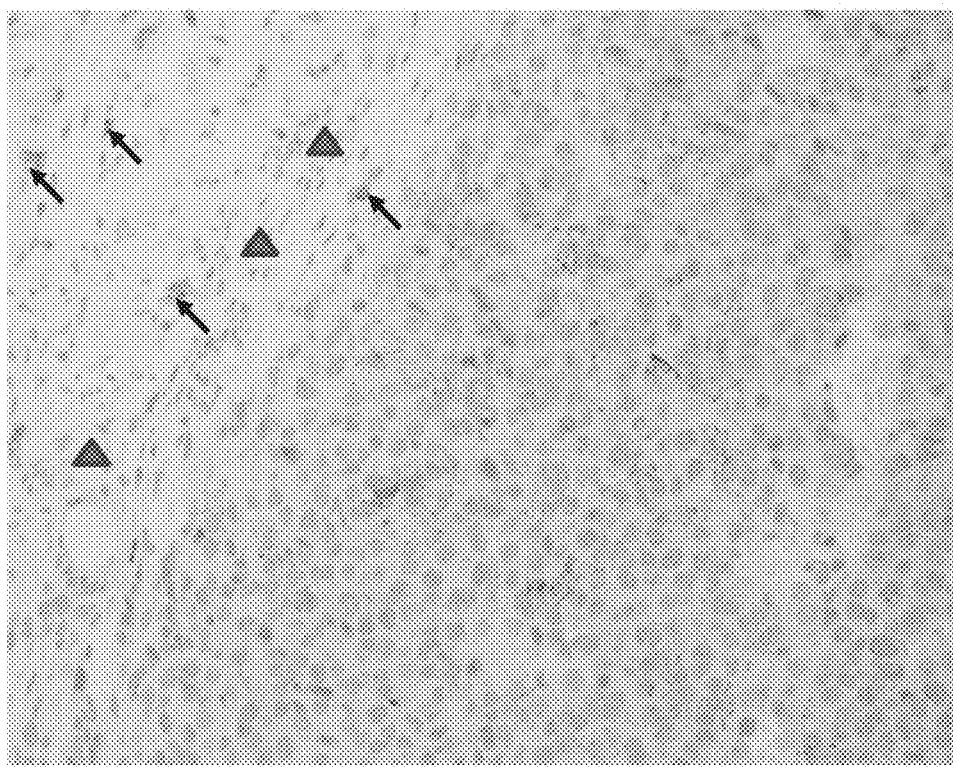
Figure 1H:
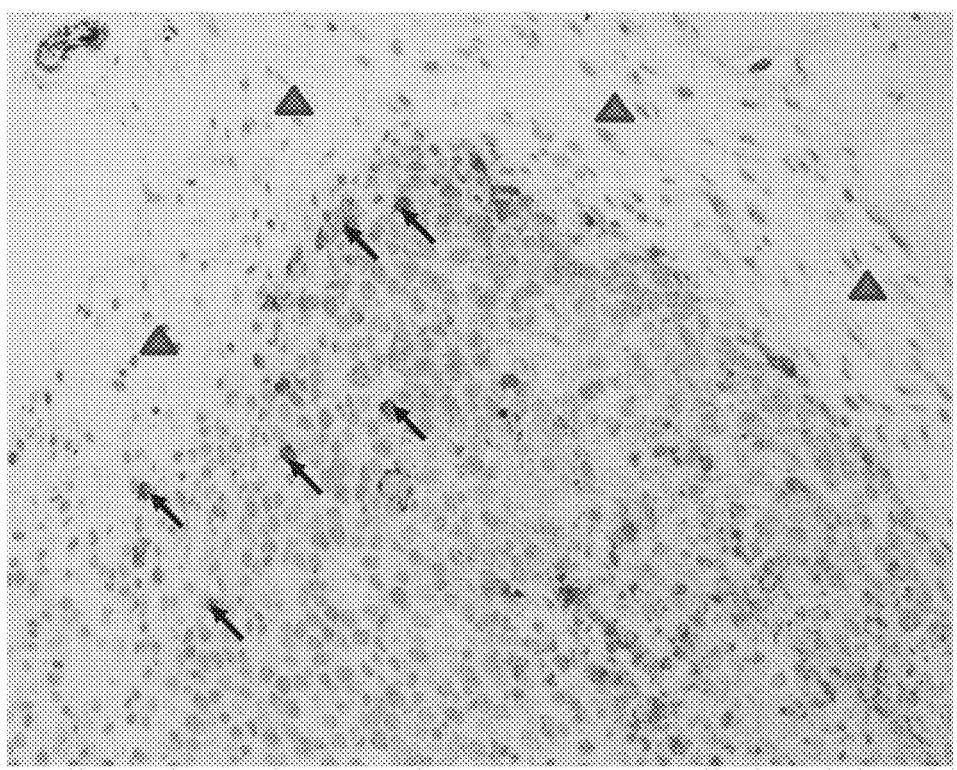
Figure 1H:
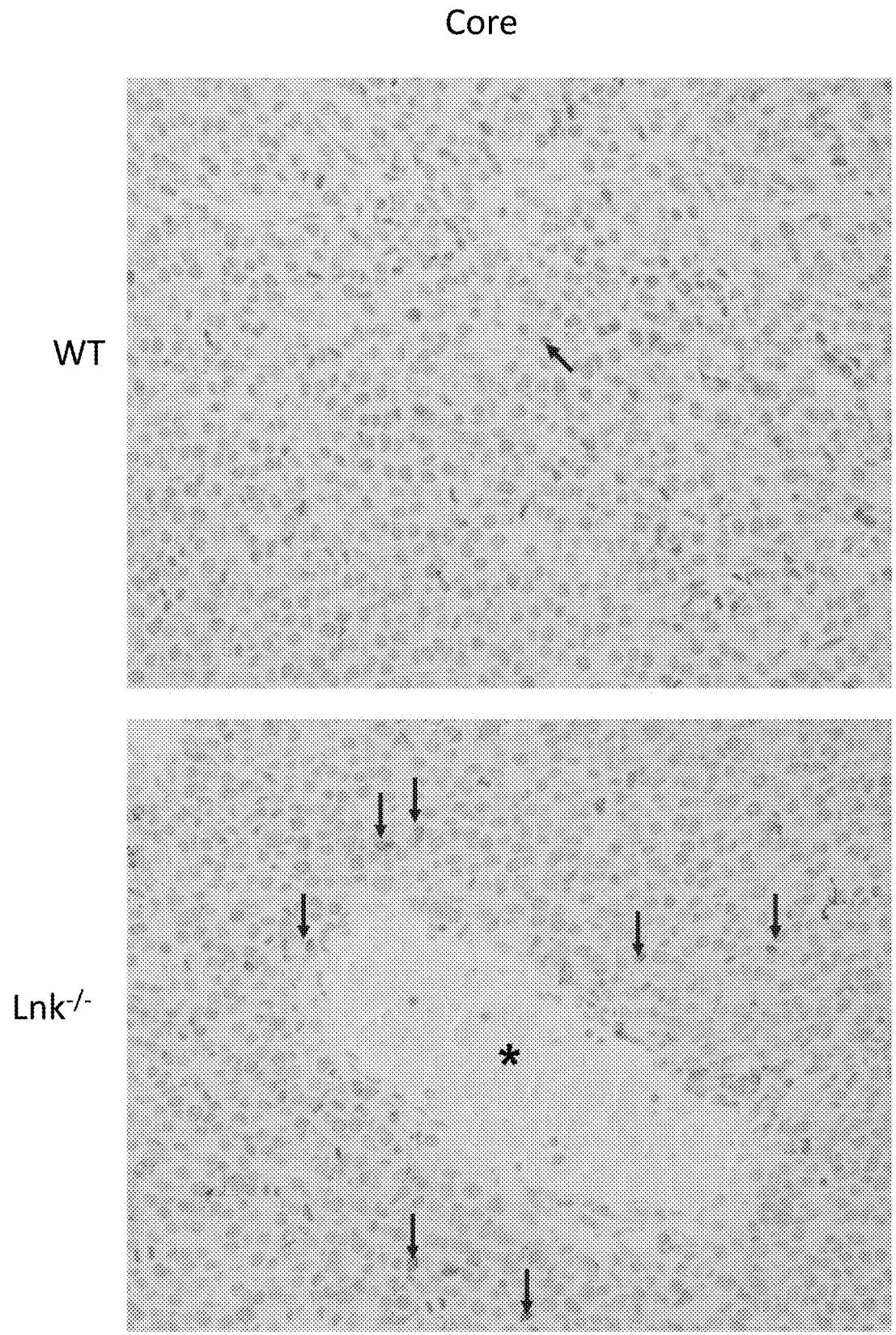
Figure 1I:
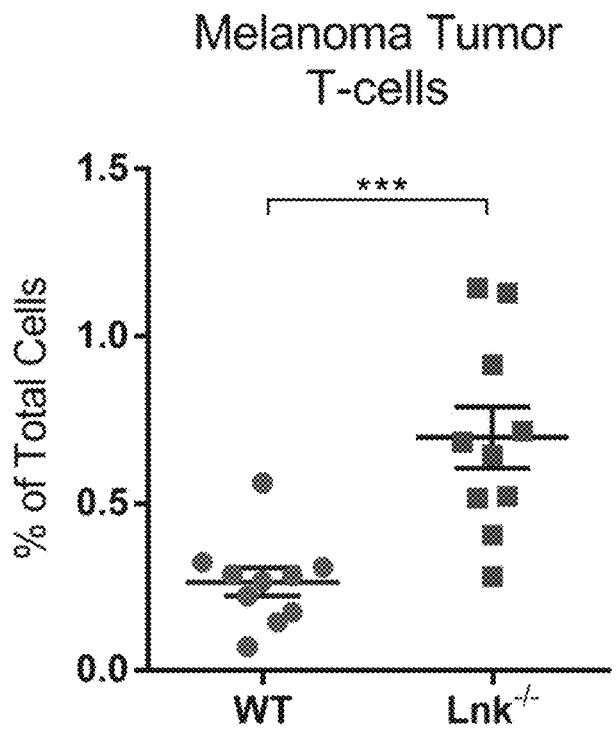
Figure 1J:
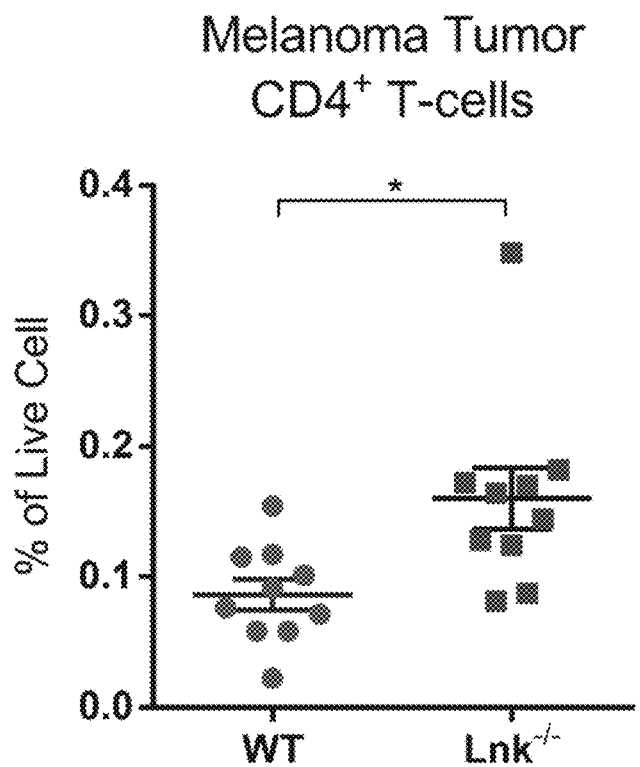
Figure 1K:
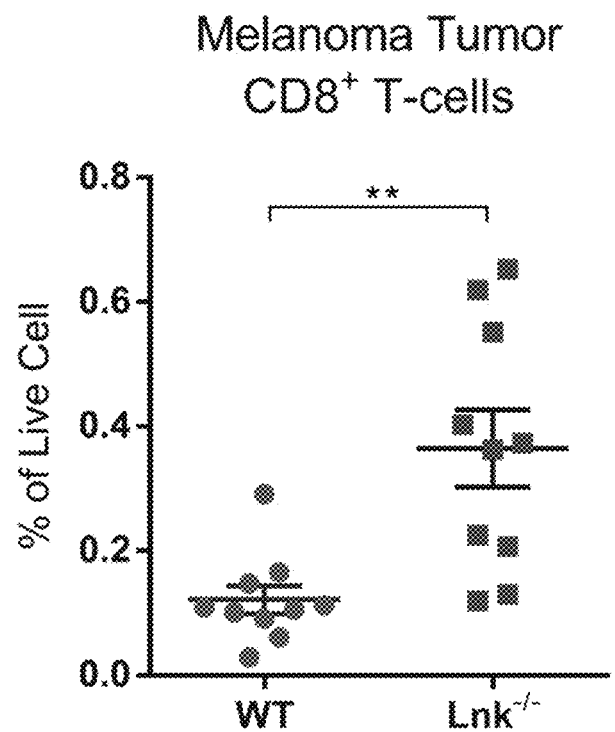
Figure 1L:
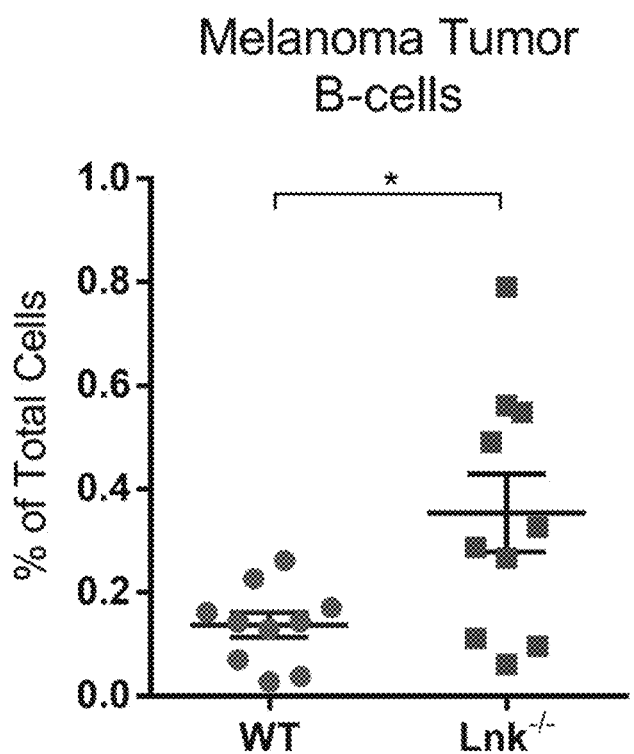
Figure 1M:
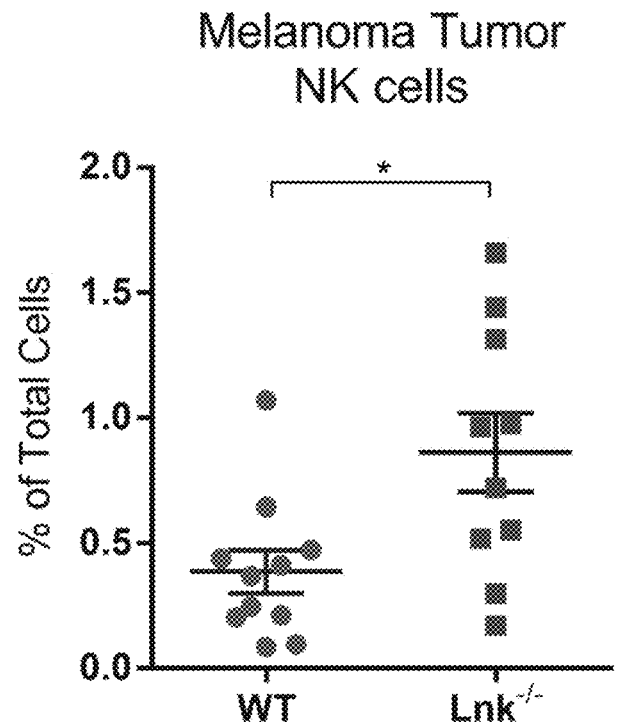
Figure 1N:
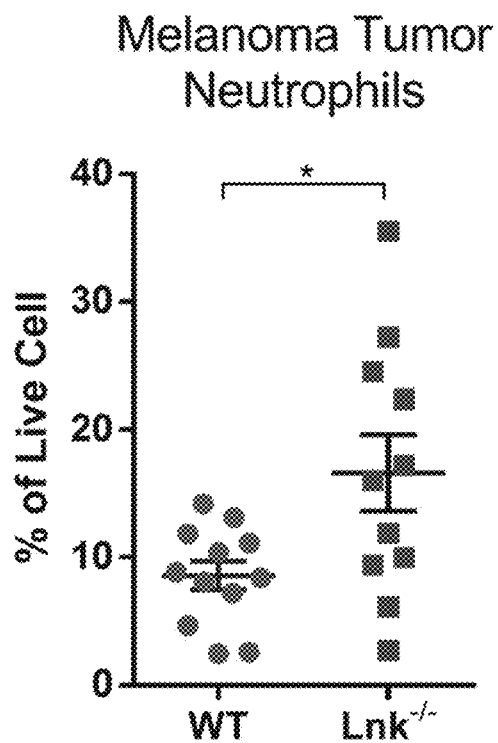
Figure 1O:
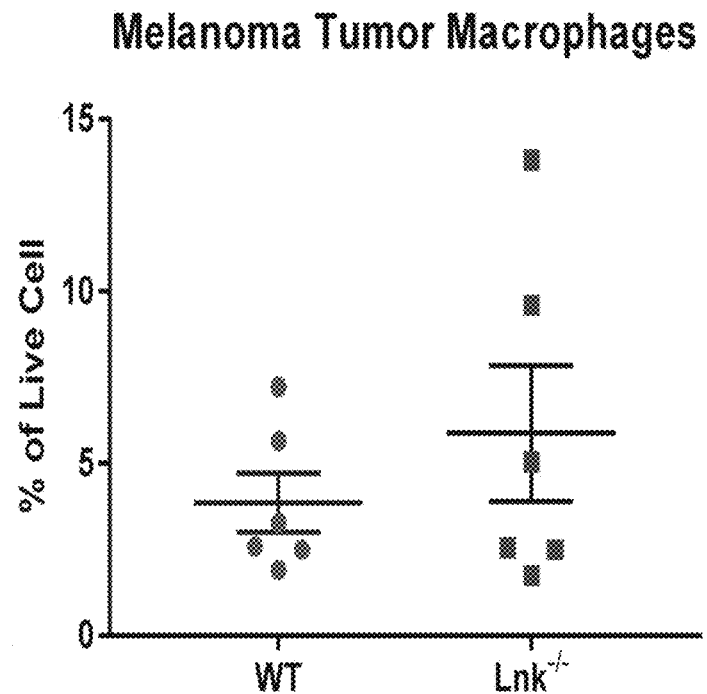
Figure 1P:
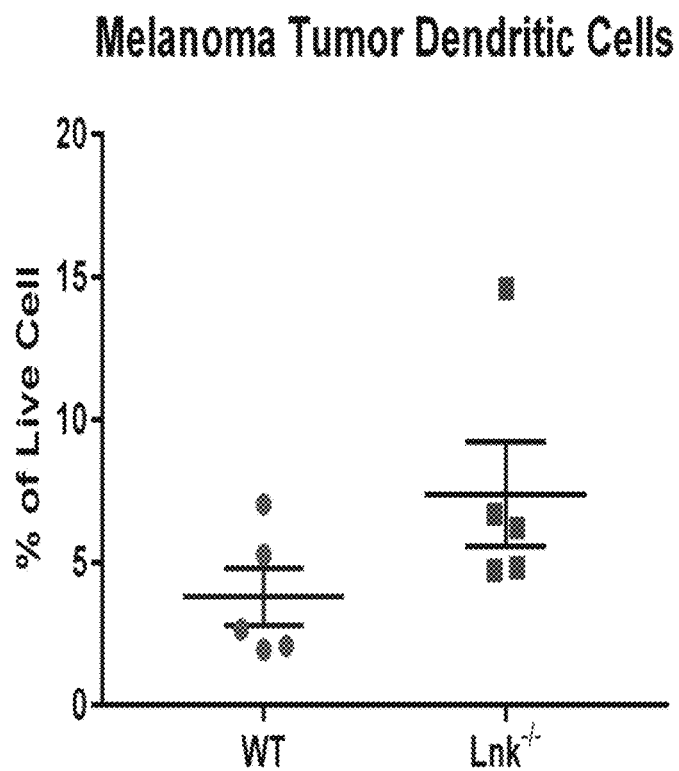

The population of infiltrating cells was further assayed in order to determine the identity of the cells. CD3-zeta chain positive T cells (FIG. 1F) were stained for CD8α and CD4 surface expression (FIG. 1G). More than twice as many infiltrating cells were CD3-zeta positive in the tumors from Lnk KO mice. Similarly, the ratio of CD8+ cytotoxic T-cells to CD4 helper cells was more than 3 times higher in tumors from Lnk KO mice. Staining with an anti-CD8α antibody confirmed that the infiltrating cells seen in the interphase of the tumor from Lnk KO mice were indeed cytotoxic T cells (FIG. 1H, left). These cells were also seen in the core of the tumor (FIG. 1H, right). The infiltrating cell population comprises increased numbers of total T-cells (CD3) (FIG. 1I), T-Helper cells (CD4) (FIG. 1J), Cytotoxic T cells (CD8) (FIG. 1K), B-cells (CD45R) (FIG. 1L), NK cells (CD161b/c) (FIG. 1M), neutrophils (CD11b) (FIG. 1N), macrophages (F4/80) (FIG. 1O), and dendritic cells (CD11c) (FIG. 1P).

Figure 1Q:
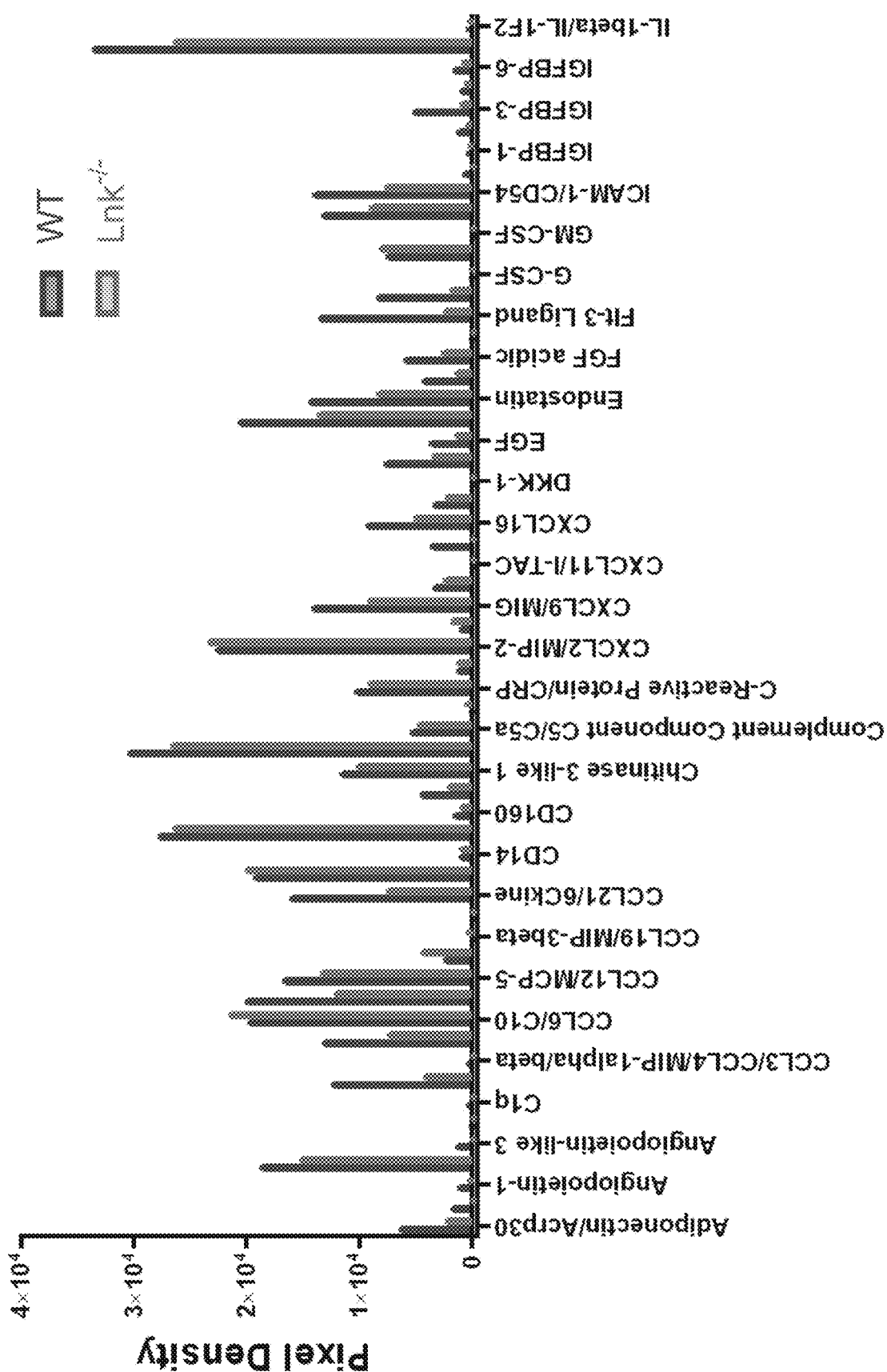
Figure 1R:
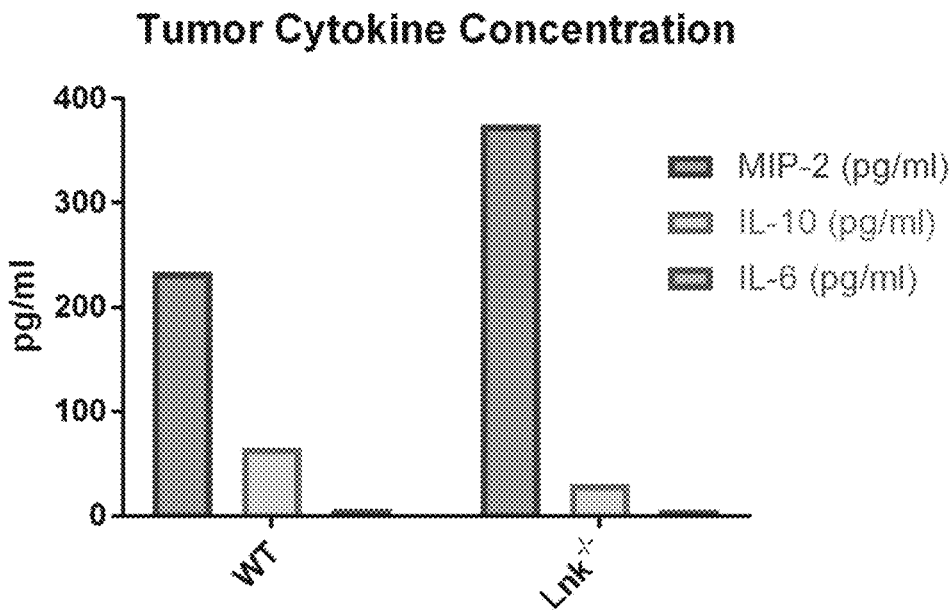

Cytokine analysis in the TME did not show any obvious changes in secretion between tumors from WT and Lnk KO mice (FIG. 1Q). The largest change observed was a non-significant increase in MIP-2 (IL-8) (FIG. 1R). It was hypothesized that LNK may function in CD8+ T cells downstream of CXCR1/2 activation, and act as a repressor of cellular activity. Thus, in the KO mice increased cellular activation would occur leading to the observed increase in cytotoxic T cell migration to the tumor and the resultant decrease in tumor size.

Example 2: Increased Cellular Activation in CD8+ Lnk KO T Cells

Figure 2A:
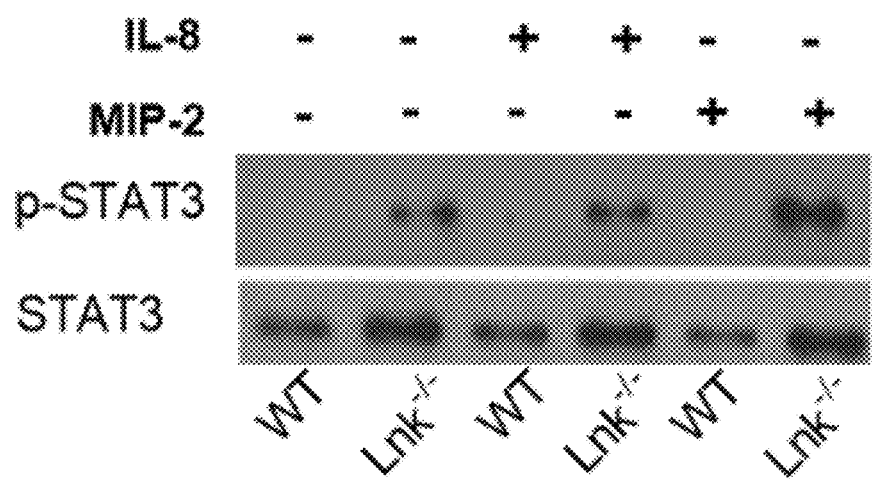
FIGS. 2A-2F: (2A) Photographs of immunoblotting of pSTAT3 and STAT3 from lysates of CD8+ splenocytes. (2B) A bar chart quantifying the relative phosphorylation of STAT3 from FIG. 2A. (2C) Photographs of immunoblotting of pSTAT3 and STAT3 from lysates of CD8+ splenocytes from tumor bearing mice. (2D) A bar chart quantifying the relative phosphorylation of STAT3 from FIG. 2C. (2E) Photographs of immunoblotting of pErk and Erk from lysates of CD8+ splenocytes. (2F) A bar chart quantifying the relative phosphorylation of Erk from FIG. 2E.
Figure 2B:
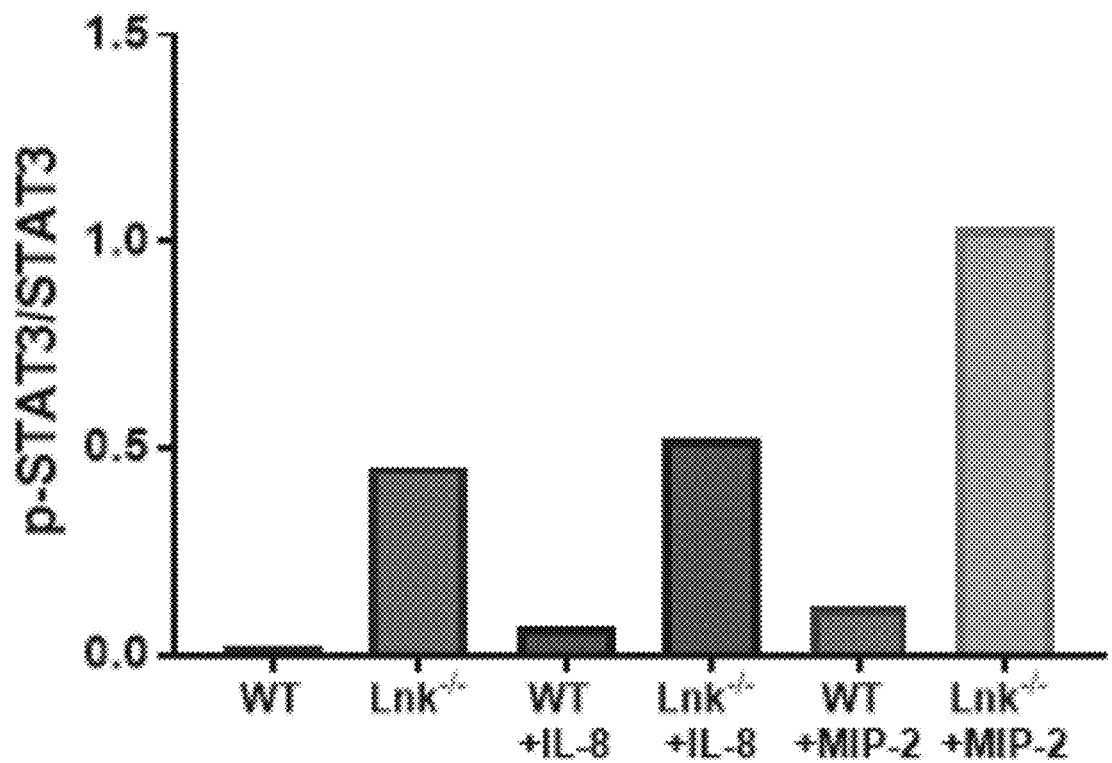
Figure 2C:
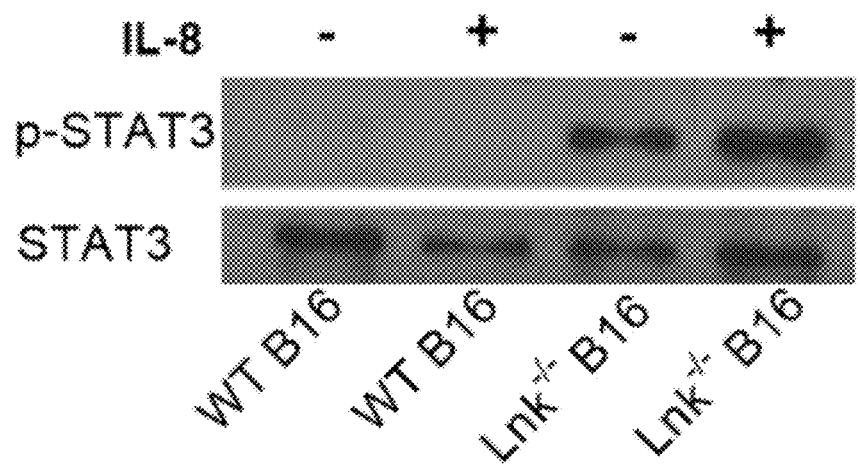
Figure 2D:
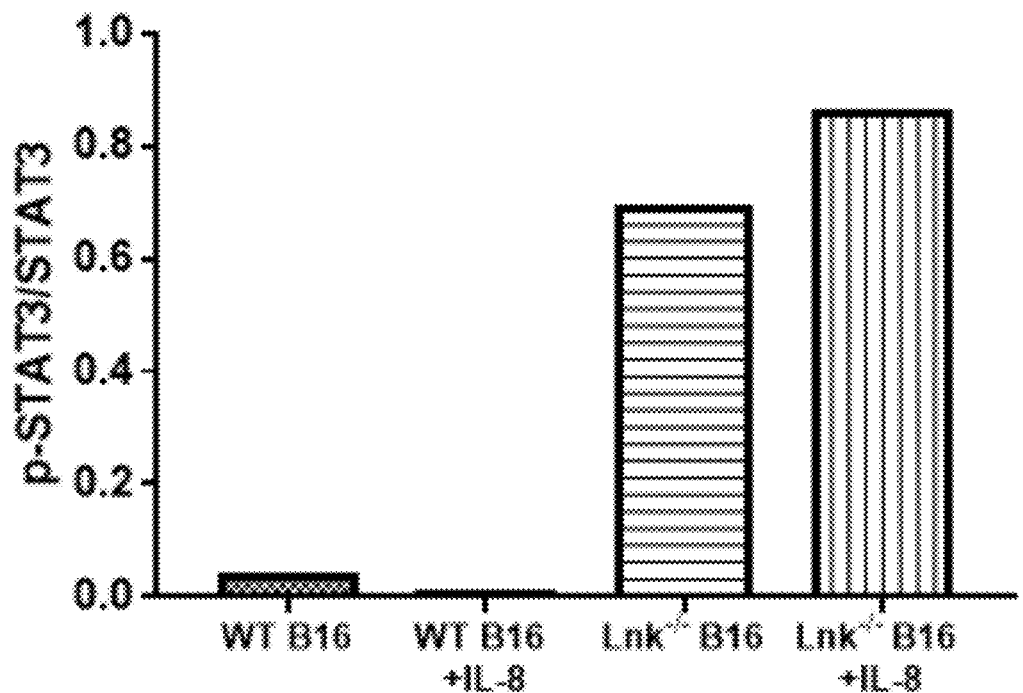
Figure 2E:
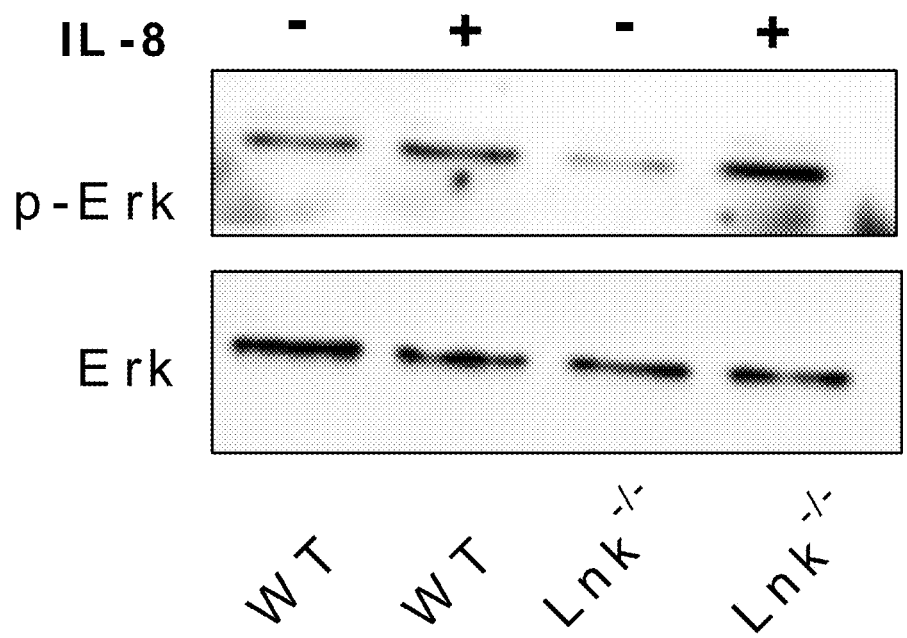
Figure 2F:
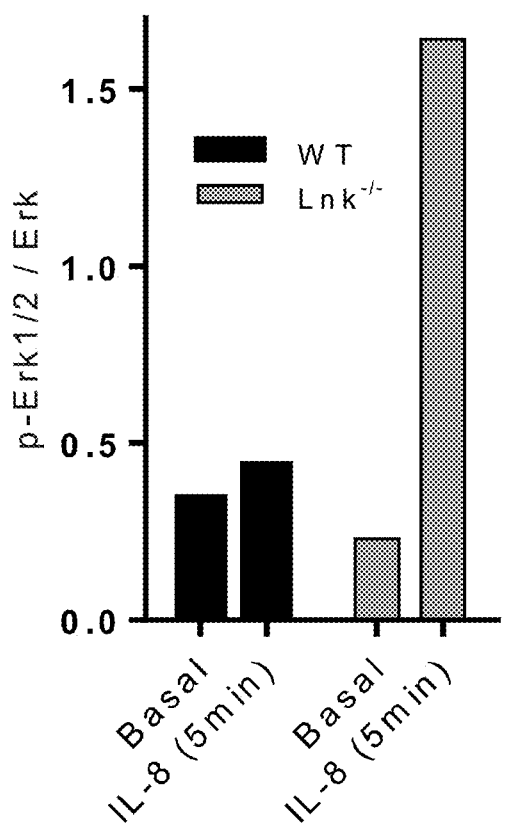

MIP-2, and IL-8 both signal through the CXCR1 and CXCR2 receptors. To test the role of LNK in CXCR receptor signal transduction. Spleen-derived CD8+ T-cells of naïve mice of both genotypes (WT or Lnk−/−) were stimulated for 5 minutes with Mip-2 or human IL-8 prior to lysis and blotting. The phosphorylation of STAT3, as a readout for signal transduction, was measured using anti p-STAT3 antibody, and compared to the total level of STAT3 in the lysate (FIG. 2A). A significant increase in the phosphorylation of STAT3 was detected in Lnk−/− CD8+ T-cells after stimulation with Mip-2, a mouse homolog for human IL-8 (FIG. 2B). Next, spleen-derived CD8+ T-cells from mice of both genotypes bearing melanoma tumors were stimulated for 5 minutes with IL-8 prior to lysis and blotting (FIG. 2C). An increased basal phosphorylation of STAT3 was detected in Lnk−/− spleen-derived CD8+ T-cells of tumor bearing Lnk KO mice, and a further increase in the phosphorylation of STAT3 was seen after stimulation of these cells with IL-8 (FIG. 2D). When another signaling molecule, Erk (MAPK3), was examined (FIG. 2E), no basal increase was observed, but increased phosphorylation was observed in response to IL-8 in the Lnk KO splenic CD8+ cells (FIG. 2F).

Figure 3A:
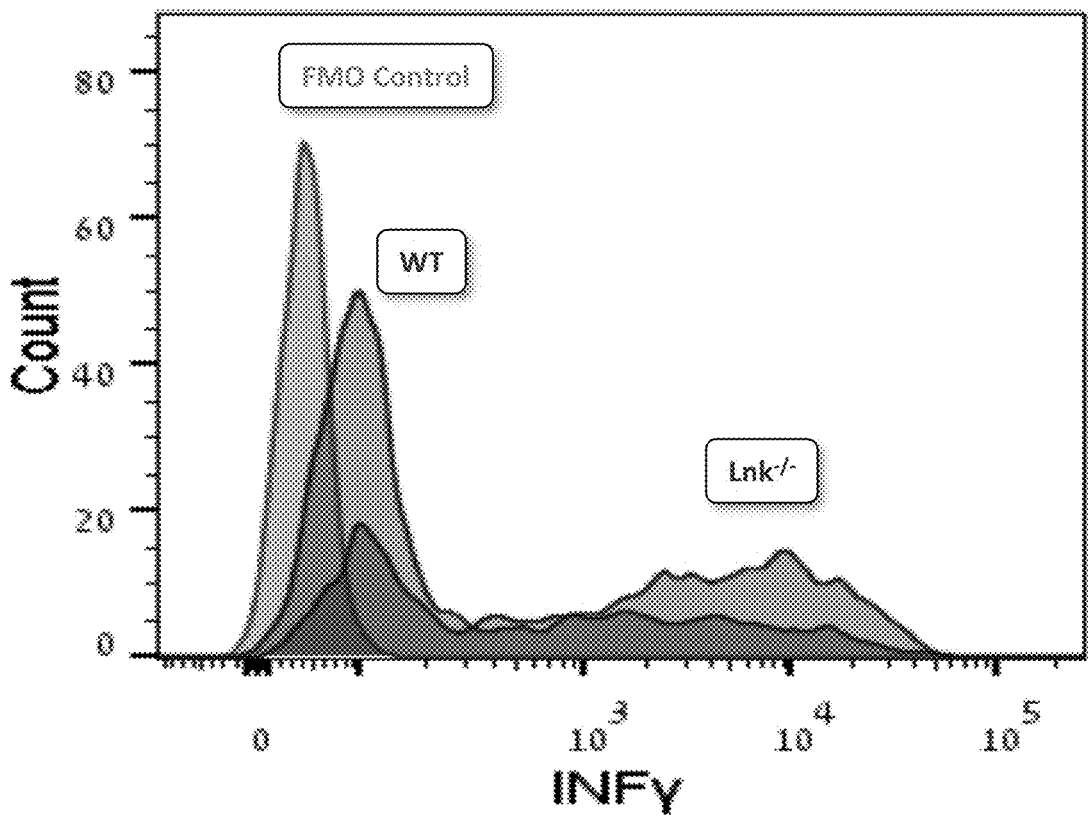
FIGS. 3A-C: (3A) A bar chart of fold induction of INFγ geometric mean fluorescence intensity (gMFI) in CD8$^+$ T-cell populations of WT and Lnk KO naïve and tumor bearing mice. The gMFI of activated cells was normalized to the gMFI of non-activated cells and is expressed as fold induction. (3B) Representative histograms of INFγ fluorescence intensity in CD8$^+$ T-cell populations of tumor bearing mice of both genotypes. FMO—Fluorescence minus one control. (3C) Bar chart of the percent of CD8$^+$ T-cells that produced INFγ (of naïve and tumor bearing mice of both genotypes). Naïve n=3 mice/group; Tumor bearing n=7 mice/group. The error bar indicates mean with SEM. Significance was determined by two-way ANOVA (Sidak's posttest). ns—nonsignificant, *0.001≥p, **0.0001≥p.
Figure 3B:
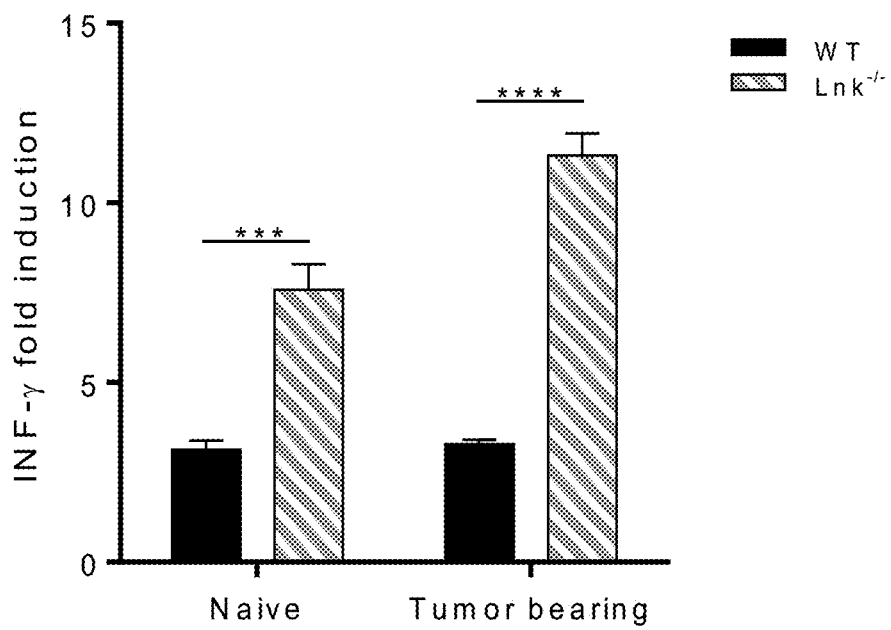
Figure 3C:
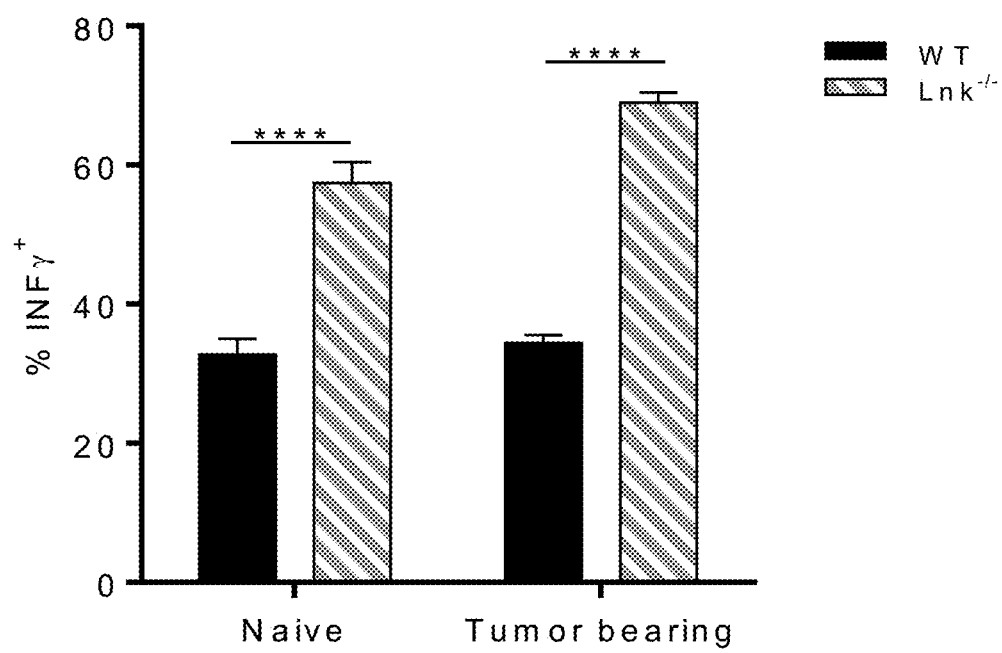

In order to further test activation differences between Lnk KO and WT cells, lymph node cells were harvested from inguinal lymph nodes of WT and Lnk KO mice. Cells were acquired from both naïve and tumor bearing mice of both genotypes. Following treatment with IL-2, and activation with PMA and Ionomycin in the presence of Brefeldin A for 6 hours, intracellular interferon gamma was measured in CD8α positive cytotoxic T cells (FIG. 3A). Fold induction of INFγ expression was calculated over the expression in non-activated cells of the same phenotype, and a statistically significant increase was observed in the LnkKO cells of tumor bearing mice as compared to their WT counterparts (FIG. 3B). When the total number of INFγ positive cells was counted the same increase in cells from tumor bearing mice was also observed (FIGS. 3C and 3D).

Example 3: In-Vivo Adoptive Cell Transfer of Lnk KO Cytotoxic T-Cells

Next the ability to transfer Lnk KO cytotoxic T-cells with enhanced cellular activation was assessed. B16-F10 melanoma cells were transplanted subcutaneously into WT and Lnk−/− donor mice. Spleen of tumor bearing donor mice (WT or Lnk−/−) was harvested on day 14, and CD8+ T-cells were isolated from the total splenocyte population. The isolated CD8+ T-cells (WT or Lnk−/−) were covalently labeled using the fluorescent dye CellTrace Violet (C34557, Thermo Fisher Scientific) and transferred to WT recipient mice. Each WT recipient received spleen derived CD8+ T-cells from a single tumor bearing donor, either WT or Lnk KO.

Figure 4:
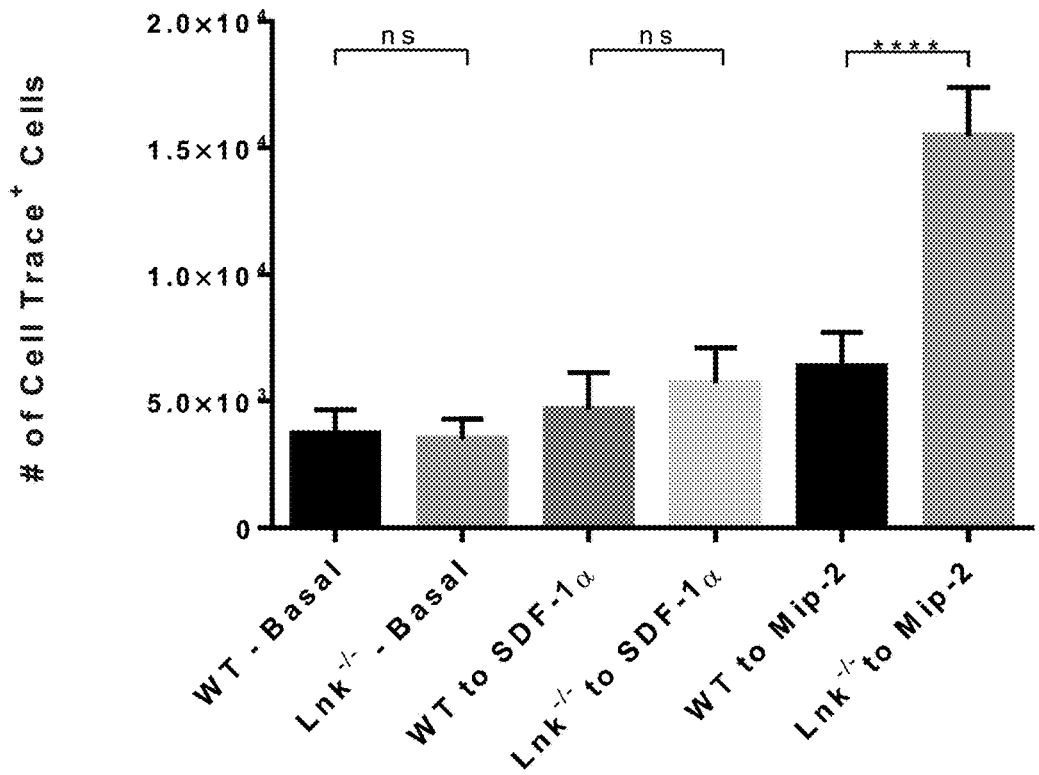
FIG. 4: A bar graph of the number of fluorescent CD8+ T-cells from WT and Lnk KO donor mice in various plugs inserted into WT mice. ns=non-significant, ****p=Value<0.0001, n=50, Error bars indicates Mean with SEM.

Following cell transfer, recipient mice were subcutaneously injected with two chemokine carrying Matrigel-plugs, one plug into each of their rear flanks. The two plugs each contained a single chemokine. The bilateral combination of chemokine containing plugs on a single recipient was one of the following [left plug:right plug]: —water:water; Mip-2:water; SDF-1α:Mip-2. 24 hours later the plugs were harvested and dissolved into single cell suspensions which were analyzed by FACS for the presence of the fluorescently labeled CD8+ cells. The number of detected T-cells derived from Lnk KO donors was significantly increased in Mip-2 containing plugs (FIG. 4). No significant difference was seen in the number of detected T-cells, of both genotypes, in plugs containing water, or plugs containing SDF-1α.

Example 4: Modified Chemotaxis Assay

The role of Lnk regulation in the CXCR1/2-mediated migration of T-cells to melanoma was examined in vitro by a chemotaxis assay modified with Matrigel. B16-F10 melanoma cells were cultured and incubated in the lower wells of a Transwell systems (control Transwells contained no cells). Cells of inguinal lymph nodes were isolated from WT or Lnk KO melanoma tumor bearing mice and were either pretreated or not pretreated with a CXCR1/2 inhibitor SCH563705. The lymph node cells were then placed into the upper wells of the Transwell systems. Prior to incubation, the exterior portion of the membrane on the upper well was pre-coated with a thin layer of Matrigel to better mimic in vivo infiltration of tumors. The Transwell system was co-cultured for 16 hours, and cells were then collected from the lower well. These cells were stained for CD3, CD8 and CD4 markers and counted using an acoustic flow-cytometer to determine the number of migrating lymph node cells.

Figure 5A:
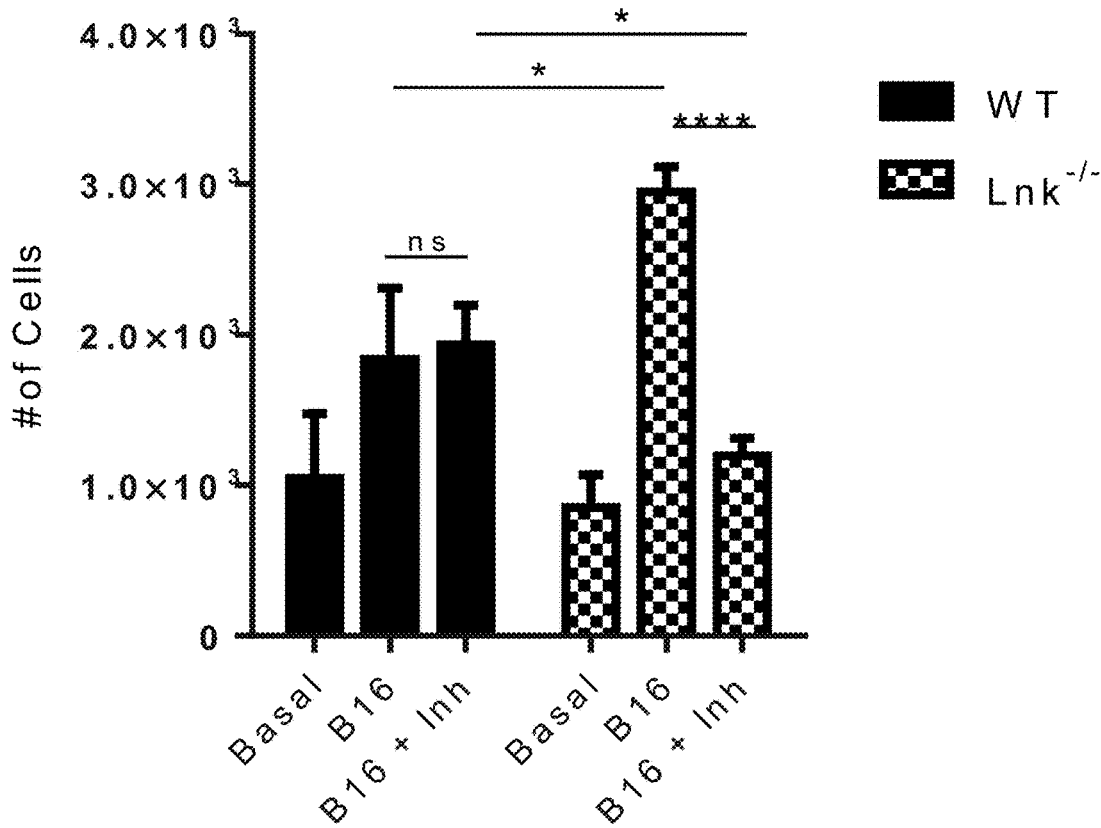
FIGS. 5A-5E: (5A-C) Bar graphs of the number of (5A) CD3+ T-cells, (5B) CD8+ T-cells and (5C) CD4+ T-cells that migrated across the transwell to reach cocultured melanoma cells. *p-Value<0.05, p-Value<0.01, *p-Value<0.001, ****p-Value<0.0001, WT n=3, KO n=6, Inh=CXCR1/2 inhibitor, Error bars indicate mean with SEM. (5D) Pie graphs of the percent of cells with a given surface marker that also expression CXCR2. (5E) A bar graph of the percent of CD8+ infiltrating cells that express CXCR1.
Figure 5B:
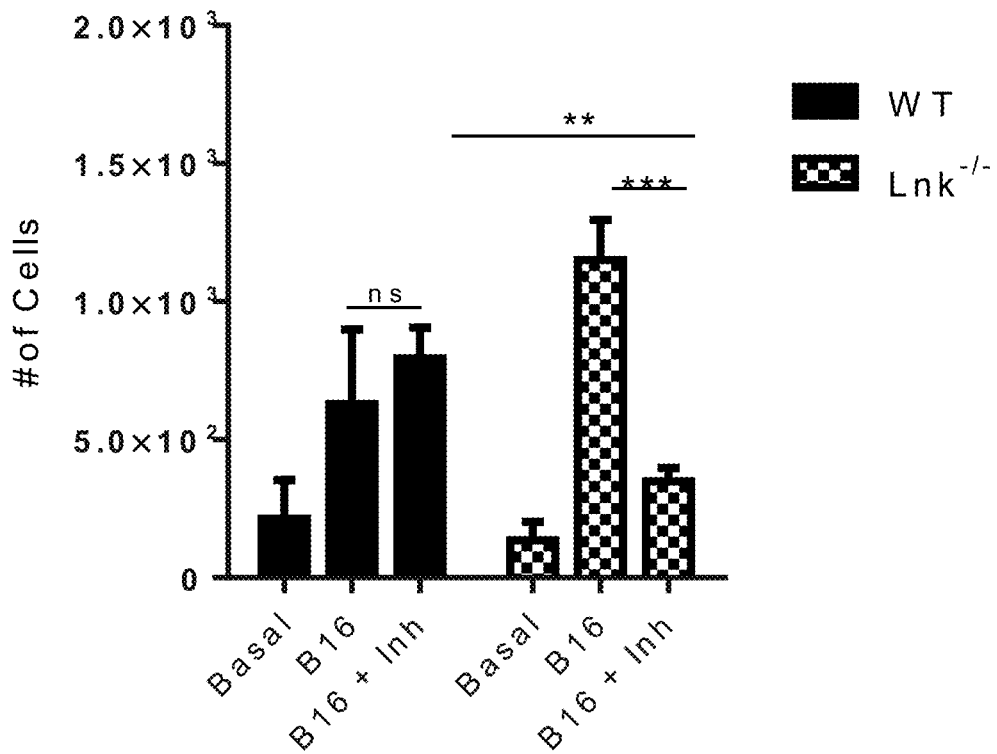
Figure 5C:
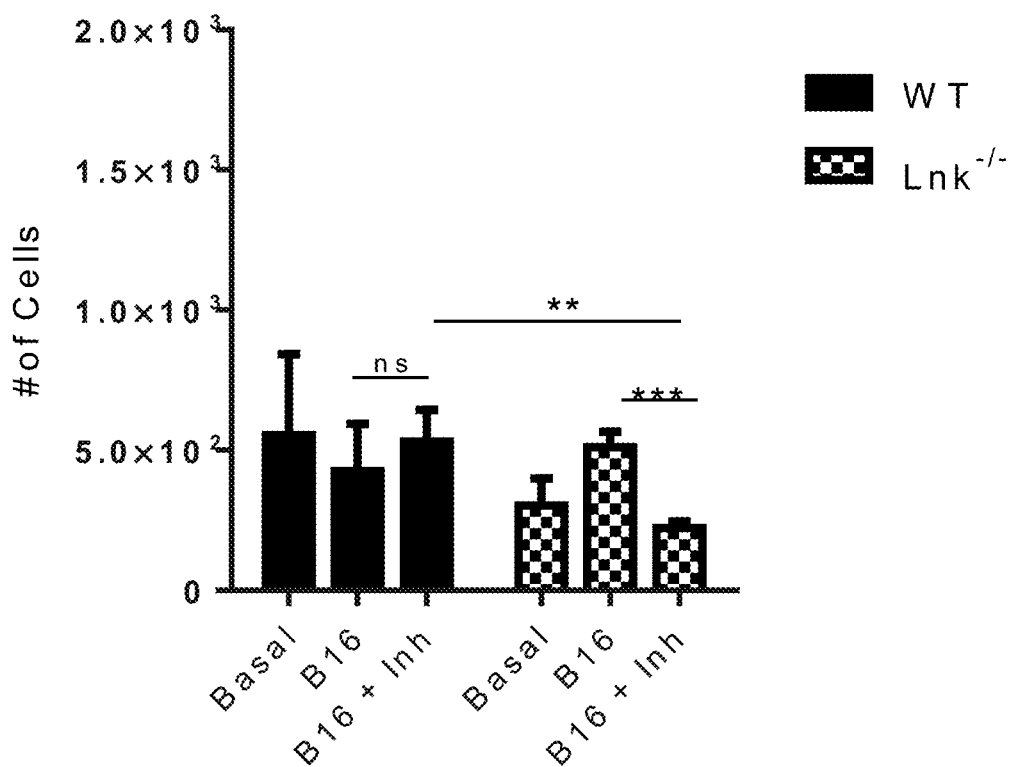

The migration of CD3+ T-cells to the B16-F10 melanoma cells was found to be increased for Lnk deficient cells as compared to WT (FIG. 5A). Furthermore, inhibition of the CXCR1/2 receptors (+lnh, right most columns of FIG. 4A) significantly decreased the migration of Lnk KO T-cells to the cancer cells, suggesting that both the CXCR1/2 pathway and Lnk regulation are involved in the regulation of T-cell migration to cancer. CXCR1/2 inhibition had no effect on the migration of WT T-cells. Similarly, CD8+ T-cells that were Lnk deficient also displayed increased migration that was CXCR1/2 dependent (FIG. 5B), however, no such increase was observed for CD4+ T-cells (FIG. 5C).

Figure 5D:
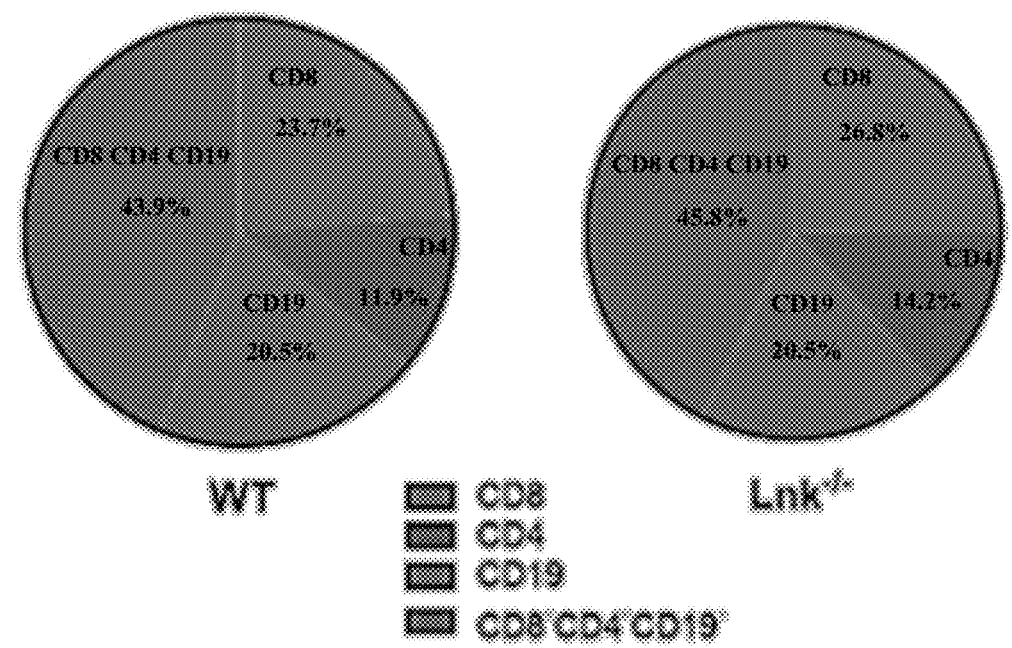
Figure 5E:
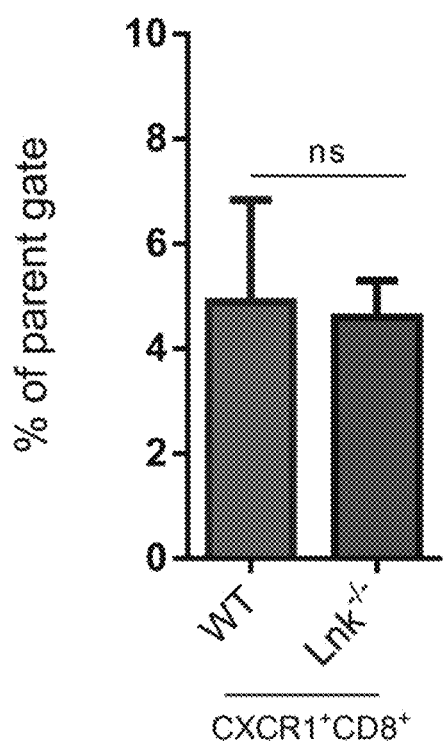

Based on this observed dependence on CXCR1/2 signaling for Lnk-deficient increased cell migration, the relative expression of CXCR2 and CXCR1 was measured in WT and Lnk KO cells. Tumor infiltrating lymphocytes were isolated from melanoma tumors in WT and Lnk KO mice, and the percentage of CD8, CD4, CD19 and CD8-CD4-CD19 positive cells that were also positive for CXCR2 was assessed (FIG. 5D). No significant difference in the expression of CXCR2 was observed on the infiltrating lymphocytes based on their genotype. Similarly, infiltrating CD8+ T-cells from both genotypes were assessed for CXCR1 expression and no significant difference was observed (FIG. 5E). All this suggests that Lnk regulation occurs at the signal transduction level and is not due to fluctuations in ligand or receptor expression.

Example 5: Lnk KO Mice Show Decreased Tumor Size in a Lung Model

Figure 6A:
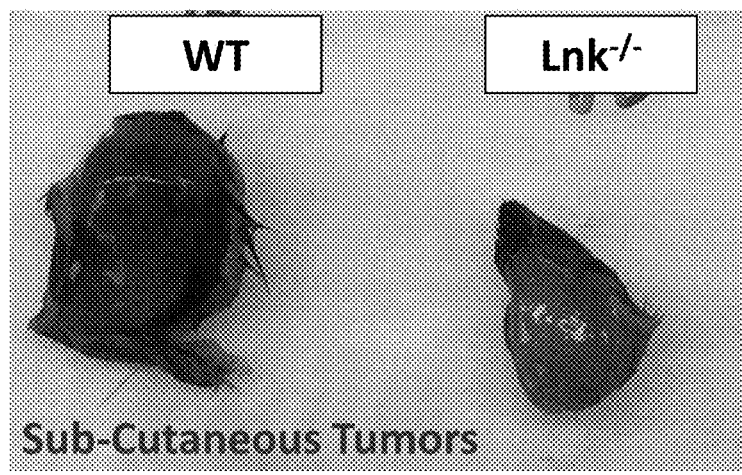
FIGS. 6A-6B: (6A) Representative images of LLC subcutaneous tumors grown in WT host (left) and in Lnk$^{-/-}$ host (right) mice. The image was taken after tumor harvest at day 14 of tumor growth. (6B) A scatter plot of LLC tumor weights from WT and Lnk KO mice.
Figure 6B:
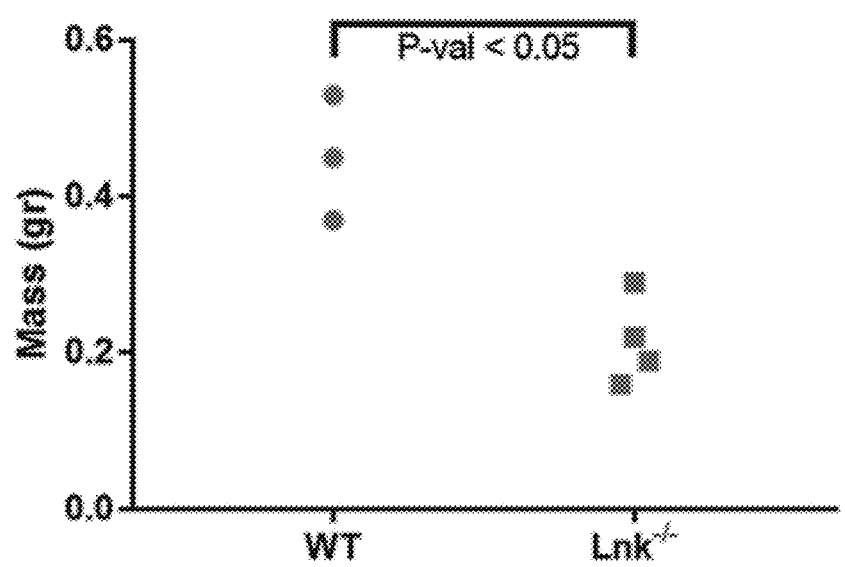

In a model similar to the melanoma model, cells of a Lewis Lung Carcinoma (LLC) cell-line were subcutaneously injected into WT and Lnk$^{-/-}$ mice at the rear back. Tumor growth was monitor for 14 days at which time tumors were then harvested and weighed. Similar to the results from melanoma cells, tumors from Lnk KO mice were visibly smaller (FIG. 6A) and had a decreased weight of on average about half of the weight of tumors from WT mice (FIG. 6B). These results show that the efficacy of Lnk KO T-cells against cancer cells is not limited by the type of cancer, but rather is a universal phenomenon.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A method of treating an Interleukin 8 (IL-8) expressing cancer in a subject in need thereof, the method comprising selecting a subject with an IL-8 expressing cancer and administering to said subject a modified CD8+ T cell comprising a decrease of at least 70% in SH2B adapter protein 3 (SH2B3) protein expression, function or both as compared to a wild-type CD8+ T cell, thereby treating said IL-8 expressing cancer.

2. The method of claim 1, wherein said modified CD8+ T cell is allogenic to said subject, or said modified CD8+ T cell is obtained from said subject and SH2B3 protein expression and/or function is decreased in said obtained cell before said administering or both.

3. The method of claim 1, wherein said decreased SH2B3 protein expression, function or both comprises decreased SH2B3 mRNA levels, decreased SH2B3 protein levels, decreased SH2B3 protein function, or a combination thereof.

4. The method of claim 3, wherein said modified CD8+ T cell comprises an SH2B3 inhibitor molecule selected from a small nucleic acid molecule that hybridizes to SEQ ID NO: 4 and inhibits SH2B3 mRNA transcription and/or translation, and a genome editing agent for mutation of a SH2B3 genetic locus.

5. The method of claim 4, wherein said small nucleic acid molecule that hybridized to SEQ ID NO: 4 and inhibits SH2B3 mRNA transcription and/or translation is an antisense RNA that binds to SEQ ID NO: 4.

6. The method of claim 1, wherein said modified CD8+ T cell further comprises a chimeric antigen receptor (CAR).

7. The method of claim 6, wherein
said CAR binds to a target antigen on a cell associated with said cancer,
said CAR binds to a target antigen on a cell selected from a cancer cell, a bacterial cell, a fungal cell, a parasite cell and a cell infected with a virus, or
both (a) and (b).

8. The method of claim 1, further comprising administering an anticancer therapeutic treatment.

9. A method of determining suitability of a subject suffering from cancer to be treated by the method of claim 1, the method comprising a. receiving a cancer cell from said subject; and b. assaying chemotaxis of unmodified CD8+ T cells and modified CD8+ T cells comprising at least a 70% decrease in SH2B3 protein expression and/or function as compared to wild type CD8+ T cells to said received cancer cell;
wherein improved chemotaxis of said modified CD8+ T cells as compared to said unmodified CD8+ T cells indicates said subject is suitable for said treatment; and c. treating the subject identified to be suitable for treatment according to the method of claim 1.

10. The method of claim 9, wherein said assaying chemotaxis is performed ex vivo.

11. The method of claim 1, wherein said modified CD8+ T cell lacks SH2B protein expression.

12. A method for increasing CD8+ T cell infiltration into an Interleukin 8 (IL-8) expressing cancer in a subject in need thereof, the method comprising selecting a subject with an IL-8 expressing cancer and administering to said subject a modified CD8+ T cell comprising decreased of at least 70% in SH2B adapter protein 3 (SH2B3) protein expression, function or both as compared to a wild-type CD8+ T cell, thereby increasing CD8+ T cell infiltration into the IL-8 expression cancer.

13. The method of claim 12, wherein said modified CD8+ T cell lacks SH2B protein expression.

14. The method of claim 12, wherein said modified CD8+ T cell is allogenic to said subject, or said modified CD8+ T cell is obtained from said subject and SH2B3 protein expression and/or function is decreased in said obtained cell before said administering or both.

15. The method of claim 12, wherein said modified CD8+ T cell comprises an SH2B3 inhibitor molecule selected from a small nucleic acid molecule that hybridizes to SEQ ID NO: 4 and inhibits SH2B3 mRNA transcription and/or translation, and a genome editing agent for mutation of a SH2B3 genetic locus.

16. The method of claim 12, wherein said modified CD8+ T cell further comprises a chimeric antigen receptor (CAR).

* * * * *

SEQUENCE LISTING

```
<160> NUMBER OF SEQ ID NOS: 4

<210> SEQ ID NO 1
<211> LENGTH: 548
<212> TYPE: PRT
<213> ORGANISM: Mus musculus

<400> SEQUENCE: 1

Met Asn Glu Pro Thr Val Gln Pro Ser Arg Thr Ser Ser Ala Pro Ala
1               5                   10                  15

Ser Pro Ala Ser Pro Arg Gly Trp Ser Asp Phe Cys Glu Gln His Ala
            20                  25                  30

Ala Ala Ala Ala Arg Glu Leu Ala Arg Gln Tyr Trp Leu Phe Ala Arg
        35                  40                  45

Ala His Pro Gln Pro Pro Arg Ala Asp Leu Val Ser Leu Gln Phe Ala
    50                  55                  60

Glu Leu Phe Gln Arg His Phe Cys Arg Glu Val Arg Glu Ser Leu Ala
65                  70                  75                  80

Gly Pro Pro Gly His Asp Tyr Arg Ala Thr Ala Pro Pro Arg Pro Ala
                85                  90                  95

Leu Pro Lys Ala Arg Ser Ser Glu Asp Leu Gly Pro Arg Pro Ala Cys
            100                 105                 110

Ala Leu Gln His Leu Arg Arg Gly Leu Arg Gln Leu Phe Arg Arg Arg
        115                 120                 125

Ser Ala Gly Glu Leu Pro Gly Ala Thr Ser Asp Thr Asn Asp Ile Asp
    130                 135                 140

Thr Thr Ala Ala Ser Arg Pro Gly Pro Ala Arg Lys Leu Leu Pro Trp
145                 150                 155                 160

Gly Leu Arg Glu Pro Pro Thr Glu Ala Leu Lys Glu Val Val Leu Arg
                165                 170                 175
```

Tyr Ser Leu Ala Asp Glu Ala Ala Met Asp Ser Gly Ala Arg Trp Gln
            180                 185                 190

Arg Gly Arg Leu Val Leu Arg Ser Pro Gly Pro Gly His Ser His Phe
        195                 200                 205

Leu Gln Leu Phe Asp Pro Pro Lys Ser Ser Lys Pro Lys Leu Gln Glu
    210                 215                 220

Ala Cys Ser Ser Ile Arg Glu Val Arg Pro Cys Thr Arg Leu Glu Met
225                 230                 235                 240

Pro Asp Asn Leu Tyr Thr Phe Val Leu Lys Val Gln Asp Gln Thr Asp
                245                 250                 255

Ile Ile Phe Glu Val Gly Asp Glu Gln Gln Leu Asn Ser Trp Leu Ala
            260                 265                 270

Glu Leu Arg Ala Ser Thr Gly Leu Gly Leu Glu His Pro Asp Thr Glu
        275                 280                 285

Leu Pro Leu Ser Leu Ala Ala Glu Pro Gly Pro Ala Arg Ser Pro Arg
    290                 295                 300

Gly Ser Thr Asp Ser Leu Asp Gln Gly Ala Ser Pro Gly Val Leu Leu
305                 310                 315                 320

Asp Pro Ala Cys Gln Lys Thr Asp His Phe Leu Ser Cys Tyr Pro Trp
                325                 330                 335

Phe His Gly Pro Ile Ser Arg Val Arg Ala Ala Gln Leu Val Gln Leu
            340                 345                 350

Gln Gly Pro Asp Ala His Gly Val Phe Leu Val Arg Gln Ser Glu Ser
        355                 360                 365

Arg Arg Gly Glu Tyr Val Leu Thr Phe Asn Leu Gln Gly Arg Ala Lys
    370                 375                 380

His Leu Arg Leu Val Leu Thr Glu Arg Gly Gln Cys Arg Val Gln His
385                 390                 395                 400

Leu His Phe Pro Ser Val Val Asp Met Leu Arg His Phe Gln Arg Ser
                405                 410                 415

Pro Ile Pro Leu Glu Cys Gly Ala Ala Cys Asp Val Arg Leu Ser Gly
            420                 425                 430

Tyr Val Val Leu Ser Gln Ala Pro Gly Ser Ser Asn Thr Val Leu
        435                 440                 445

Phe Pro Phe Ser Leu Pro His Trp Asp Ser Glu Leu Gly His Pro His
    450                 455                 460

Leu Ser Ser Val Gly Cys Pro Pro Ser His Gly Ala Glu Ala Leu Pro
465                 470                 475                 480

Gly Gln Val Thr Pro Pro Glu Gln Ile Phe His Leu Val Pro Ser Pro
                485                 490                 495

Glu Glu Leu Ala Asn Ser Leu Arg Gln Leu Glu Leu Glu Ser Val Ser
            500                 505                 510

Ser Ala Arg Asp Ser Asp Tyr Asp Met Asp Ser Ser Arg Gly His
        515                 520                 525

Leu Arg Ala Ile Asp Asn Gln Tyr Thr Pro Leu Ser Gln Leu Cys Arg
    530                 535                 540

Glu Ala Asp Val
545

<210> SEQ ID NO 2
<211> LENGTH: 1647
<212> TYPE: DNA
<213> ORGANISM: Mus musculus

<400> SEQUENCE: 2

```
atgaacgagc ccaccgtgca gccgtcccgc acatcctccg cacccgcctc gccggcatcc    60
ccacgcggct ggagcgactt ctgcgagcag cacgcagcag cggcggcccg ggagctggcc   120
cgccagtact ggttgtttgc gcgcgcgcac ccacagccgc cgcgcgcgga cctggtgtcg   180
ctgcagttcg cggagctctt ccagcgccac ttctgccggg aggtgcgcga gagcctcgca   240
ggaccgccgg gtcacgacta ccgcgccact gctccgcccc gccccgcgct gcccaaggca   300
cgcagctccg aggacctggg cccgcggccc gcctgtgccc tgcagcacct cgccgcggc   360
ctgcgccagc tcttccgccg ccgctcggca ggggagctgc ccggggctac cagtgacacc   420
aatgacatcg acaccaccgc agccagcagg ccgggcccgg cccgcaagtt gctaccctgg   480
ggcctgcgag agccgcccac tgaggcgctc aaggaggtcg tattgcgcta tagcctggcg   540
gacgaggcag caatggacag cggcgcacgc tggcagcggg gtcgcctggt gcttcggtct   600
ccaggtccgg gccacagcca ctttctgcag ctcttcgatc cgcccaagag ctcaaagccc   660
aagctccaag aggcctgttc cagcatccgg gaggtccgac catgtacacg cctggagatg   720
cctgacaacc tctacacctt tgtgttgaag gtgcaggacc agacagacat catctttgag   780
gtgggagatg aacagcagct gaactcatgg ctggcagagc tcagggcaag cacaggcctt   840
gggctggagc acccggacac cgagttacct cttccttag cggcagagcc tggcccagct   900
agatccccaa ggggaagcac tgactccctg accaaggtg cttcacctgg ggtgttgctg   960
gacccagcct gccagaaaac agatcacttc ctatcctgct accctggtt ccacggcccc  1020
atctccaggg tgagggctgc acagctggtc cagctccagg gccctgatgc ccacggcgtg  1080
ttcctggtgc ggcagagtga gtcccggaga ggagagtatg tactcacatt caacttacag  1140
ggcagagcca agcacttacg cctggtgctc acagagcgtg acagtgccg ggtgcaacac  1200
ctgcacttcc cctcggtggt agatatgctc cgccacttcc agcgttctcc tatcccactg  1260
gaatgtggag cagcttgtga cgtccgactc tctggctatg tggtagtcct ctctcaggca  1320
ccaggttcct ccaacaccgt cctcttccct ttttcccttc ctcactggga ttcggagctg  1380
ggtcatcccc acctcagctc tgttggctgt ccccccagcc atggtgcaga ggctctccct  1440
ggccaagtga caccacctga gcagatcttc cacctggtgc cttctcctga ggaactggcc  1500
aacagtctgc ggcagctgga gctcgagtct gtgagcagtg cccgggactc ggactatgac  1560
atggactcct cttcacgggg ccaccttcgg gccattgaca ccagtacac ccctctctca  1620
cagctgtgca gagaggcaga cgtgtga                                      1647
```

<210> SEQ ID NO 3
<211> LENGTH: 575
<212> TYPE: PRT
<213> ORGANISM: Homo sapiens

<400> SEQUENCE: 3

```
Met Asn Gly Pro Ala Leu Gln Pro Ser Ser Pro Ser Ser Ala Pro Ser
 1               5                  10                  15

Ala Ser Pro Ala Ala Ala Pro Arg Gly Trp Ser Glu Phe Cys Glu Leu
            20                  25                  30

His Ala Val Ala Ala Ala Arg Glu Leu Ala Arg Gln Tyr Trp Leu Phe
        35                  40                  45

Ala Arg Glu His Pro Gln His Ala Pro Leu Arg Ala Glu Leu Val Ser
    50                  55                  60

Leu Gln Phe Thr Asp Leu Phe Gln Arg Tyr Phe Cys Arg Glu Val Arg
```

```
                65                  70                  75                  80
Asp Gly Arg Ala Pro Gly Arg Asp Tyr Arg Asp Thr Gly Arg Gly Pro
                        85                  90                  95

Pro Ala Lys Ala Glu Ala Ser Pro Glu Pro Gly Pro Gly Pro Ala Ala
                100                 105                 110

Pro Gly Leu Pro Lys Ala Arg Ser Ser Glu Leu Ala Pro Pro Arg
                115                 120                 125

Pro Pro Gly Pro Cys Ser Phe Gln His Phe Arg Arg Ser Leu Arg His
            130                 135                 140

Ile Phe Arg Arg Ser Ala Gly Glu Leu Pro Ala Ala His Thr Ala
145                 150                 155                 160

Ala Ala Pro Gly Thr Pro Gly Glu Ala Ala Glu Thr Pro Ala Arg Pro
                165                 170                 175

Gly Leu Ala Lys Lys Phe Leu Pro Trp Ser Leu Ala Arg Glu Pro Pro
                180                 185                 190

Pro Glu Ala Leu Lys Glu Ala Val Leu Arg Tyr Ser Leu Ala Asp Glu
                195                 200                 205

Ala Ser Met Asp Ser Gly Ala Arg Trp Gln Arg Gly Arg Leu Ala Leu
            210                 215                 220

Arg Arg Ala Pro Gly Pro Asp Gly Pro Asp Arg Val Leu Glu Leu Phe
225                 230                 235                 240

Asp Pro Pro Lys Ser Ser Arg Pro Lys Leu Gln Ala Ala Cys Ser Ser
                245                 250                 255

Ile Gln Glu Val Arg Trp Cys Thr Arg Leu Glu Met Pro Asp Asn Leu
            260                 265                 270

Tyr Thr Phe Val Leu Lys Val Lys Asp Arg Thr Asp Ile Ile Phe Glu
            275                 280                 285

Val Gly Asp Glu Gln Gln Leu Asn Ser Trp Met Ala Glu Leu Ser Glu
            290                 295                 300

Cys Thr Gly Arg Gly Leu Glu Ser Thr Glu Ala Glu Met His Ile Pro
305                 310                 315                 320

Ser Ala Leu Glu Pro Ser Thr Ser Ser Pro Arg Gly Ser Thr Asp
                325                 330                 335

Ser Leu Asn Gln Gly Ala Ser Pro Gly Gly Leu Leu Asp Pro Ala Cys
            340                 345                 350

Gln Lys Thr Asp His Phe Leu Ser Cys Tyr Pro Trp Phe His Gly Pro
            355                 360                 365

Ile Ser Arg Val Lys Ala Ala Gln Leu Val Gln Leu Gln Gly Pro Asp
370                 375                 380

Ala His Gly Val Phe Leu Val Arg Gln Ser Glu Thr Arg Arg Gly Glu
385                 390                 395                 400

Tyr Val Leu Thr Phe Asn Phe Gln Gly Ile Ala Lys His Leu Arg Leu
                405                 410                 415

Ser Leu Thr Glu Arg Gly Gln Cys Arg Val Gln His Leu His Phe Pro
                420                 425                 430

Ser Val Val Asp Met Leu His His Phe Gln Arg Ser Pro Ile Pro Leu
            435                 440                 445

Glu Cys Gly Ala Ala Cys Asp Val Arg Leu Ser Ser Tyr Val Val Val
450                 455                 460

Val Ser Gln Pro Pro Gly Ser Cys Asn Thr Val Leu Phe Pro Phe Ser
465                 470                 475                 480

Leu Pro His Trp Asp Ser Glu Ser Leu Pro His Trp Gly Ser Glu Leu
                485                 490                 495
```

```
Gly Leu Pro His Leu Ser Ser Gly Cys Pro Arg Gly Leu Ser Pro
            500                 505                 510

Glu Gly Leu Pro Gly Arg Ser Ser Pro Pro Glu Gln Ile Phe His Leu
        515                 520                 525

Val Pro Ser Pro Glu Glu Leu Ala Asn Ser Leu Gln His Leu Glu His
    530                 535                 540

Glu Pro Val Asn Arg Ala Arg Asp Ser Asp Tyr Glu Met Asp Ser Ser
545                 550                 555                 560

Ser Arg Ser His Leu Arg Ala Ile Asp Asn Gln Tyr Thr Pro Leu
                565                 570                 575

<210> SEQ ID NO 4
<211> LENGTH: 1728
<212> TYPE: DNA
<213> ORGANISM: Homo sapiens

<400> SEQUENCE: 4
```

| | |
|---|---:|
| atgaacgggc ctgccctgca gccctcctcg ccctcttccg cgccctcagc ctccccggcg | 60 |
| gcggccccgc ggggctggag cgagttctgt gagttgcacg ccgtagcggc ggcccgggag | 120 |
| ctggcccgcc agtactggct gttcgcccgg agcatccgc agcacgcgcc gctgcgcgcc | 180 |
| gagctggtgt cgctgcagtt caccgacctc ttccagcgct acttctgccg cgaggtgcgc | 240 |
| gacggacggg cgccgggccg cgactaccgg gacacaggcc gtgggccccc agccaaggcc | 300 |
| gaggcgtccc cggagccagg ccccggcccc gccgccctg gcctgcccaa ggcccgcagc | 360 |
| tctgaggagc tggccccgcc gcggccgccc gggccctgct ccttccagca ctttcgccgc | 420 |
| agcctccgcc acatcttccg ccgccgctcg gccggggagc tgccagcggc ccacaccgct | 480 |
| gccgccccg gaccccccgg agaggctgct gagaccccg cccggcctgg cctggccaag | 540 |
| aagttcctgc cctggagcct ggcccgggag ccgccacccg aggcgctgaa ggaggcggtg | 600 |
| ctgcgctaca gcctggccga cgaggcctcc atggacagcg gggcacgctg gcagcgcggg | 660 |
| aggctggcgc tgcgccgggc cccgggcccc gatggcccg accgcgtgct ggagctcttc | 720 |
| gacccacccca agagttcaag gcccaagcta caagcagctt gctccagcat ccaggaggtc | 780 |
| cggtggtgca cacggcttga gatgcctgac aacctttaca cctttgtgct gaaggtgaag | 840 |
| gaccggacag acatcatctt tgaggtggga gacgagcagc agctgaattc atggatggct | 900 |
| gagctctcgg agtgcacagg ccgagggctg gagagcacag aagcagagat gcatattccc | 960 |
| tcagccctag agcctagcac gtccagctcc caaggggca gcacagattc ccttaaccaa | 1020 |
| ggtgcttctc ctgggggct gctggacccg gcctgccaga agacggacca tttcctgtcc | 1080 |
| tgctacccct ggttccacgg ccccatctcc agagtgaaag cagctcagct ggttcagctg | 1140 |
| cagggccctg atgctcatgg agtgttcctg gtgcggcaga gcgagacgcg cgtgggggaa | 1200 |
| tacgtgctca ctttcaactt tcaggggata gccaagcacc tgcgcctgtc gctgacagag | 1260 |
| cggggccagt gccgtgtgca gcacctccac tttccctcgg tcgtggacat gctccaccac | 1320 |
| ttccagcgct cgcccatccc actcgagtgc ggcgccgcct gtgatgtccg gctctccagc | 1380 |
| tacgtggtag tcgtctccca accaccaggt tcctgcaaca cggtcctctt ccctttctcc | 1440 |
| cttcctcact gggattcaga gtcccttcct cactgggggtt cagagttggg ccttcccac | 1500 |
| cttagttctt ctggctgtcc ccggggggctc agcccagagg gtctcccagg gcgatcctca | 1560 |

```
cccccgagc  agatcttcca  cctggtgcct  tcgcccgaag  aactggccaa  cagcctgcag   1620
cacctggagc  atgagcctgt  gaatcgagcc  cgggactcgg  actacgaaat  ggactcatcc   1680
tcccggagcc  acctgcgggc  catagacaat  cagtacacac  ctctctga                1728
```